United States Patent
Nakagawa

(10) Patent No.: US 7,336,207 B2
(45) Date of Patent: Feb. 26, 2008

(54) MODULATION TABLE, MODULATING APPARATUS AND METHOD, PROGRAM, AND RECORDING MEDIUM

(75) Inventor: Toshiyuki Nakagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/556,946

(22) Filed: Nov. 6, 2006

(65) Prior Publication Data

US 2007/0103352 A1  May 10, 2007

(30) Foreign Application Priority Data

Nov. 10, 2005  (JP) .......................... P2005-326608

(51) Int. Cl.
*H03M 7/00* (2006.01)
(52) U.S. Cl. ............................ 341/59; 341/65; 341/67
(58) Field of Classification Search .................. 341/59, 341/65, 67, 68, 69, 106
See application file for complete search history.

(56) References Cited

U.S. PATENT DOCUMENTS

| | | | |
|---|---|---|---|
| 5,506,581 A | | 4/1996 | Ito et al. |
| 5,659,577 A * | | 8/1997 | Ohishi ......................... 375/242 |
| 6,072,756 A * | | 6/2000 | Shigenobu ............... 369/47.19 |
| 6,198,710 B1 * | | 3/2001 | Hori et al. ................ 369/59.24 |
| 6,445,313 B2 * | | 9/2002 | Ahn ............................ 341/59 |
| 6,496,541 B1 | | 12/2002 | Kahlman et al. |
| 6,677,866 B2 * | | 1/2004 | Kahlman et al. ............. 341/59 |
| 6,982,660 B2 * | | 1/2006 | Nakagawa et al. ........... 341/58 |
| 7,009,532 B2 * | | 3/2006 | Ushiyama et al. ............. 341/59 |
| 7,116,250 B2 * | | 10/2006 | Coene .......................... 341/68 |
| 7,119,721 B2 * | | 10/2006 | Coene .......................... 341/59 |
| 7,158,060 B2 * | | 1/2007 | Kahlman et al. ............. 341/67 |
| 7,215,261 B2 * | | 5/2007 | Ushiyama et al. ............. 341/59 |
| 7,266,153 B2 * | | 9/2007 | Nakagawa et al. ......... 375/253 |

FOREIGN PATENT DOCUMENTS

| | | |
|---|---|---|
| JP | 6-197024 | 7/1994 |
| JP | 11-346154 | 12/1999 |

* cited by examiner

*Primary Examiner*—Linh V. Nguyen
(74) *Attorney, Agent, or Firm*—Bell, Boyd & Lloyd LLP

(57) ABSTRACT

A modulation table for converting data with a basic data length of m bits into a variable length code (d,k;m,n;r) is provided. The modulation table includes a basic table for converting data patterns into code patterns and a replacement table for replacing data patterns with code patterns. The replacement table includes minimum-run-successive-occurrence limiting data patterns for limiting the number of times of successive occurrence of the minimum run to N (N>1) or less and minimum-run-successive-occurrence limiting code patterns corresponding to the minimum-run-successive-occurrence limiting data patterns. At least one of the minimum-run-successive-occurrence limiting code patterns includes an undetermined code. A condition for determining whether the minimum-run-successive-occurrence limiting code pattern including the undetermined code is converted as a whole or divided and converted individually is defined by a data bit immediately following the minimum-run-successive-occurrence limiting data pattern corresponding to the minimum-run-successive-occurrence limiting code pattern including the undetermined code.

18 Claims, 19 Drawing Sheets

MODULATION TABLE, MODULATING APPARATUS AND METHOD, PROGRAM, AND RECORDING MEDIUM

CROSS-REFERENCES TO RELATED APPLICATIONS

The present application claims priority to Japanese Patent Application JP 2005-326608 filed in the Japanese Patent Office on Nov. 10, 2005, the entire contents of which being incorporated herein by reference.

BACKGROUND

The present disclosure relates to a modulation table, a modulating apparatus and a modulating method, a program, and a recording medium, and, more particularly to a modulation table, a modulating apparatus and a modulating method, a program, and a recording medium adapted to reduce successive occurrence of a minimum run.

In transmitting data on a predetermined transmission line or recording data in a recording medium such as a magnetic disk, an optical disk, or a magneto-optical disk, data is modulated to be suitable for the transmission line or the recording medium. As one of methods for such modulation, a block code is known. The block code is a code for converting a data row into blocks of m×i bit units (hereinafter referred to as data word) and converting this data word into a code word including n×i bits in accordance with an appropriate code rule. When i=1, this code word is a fixed length code. When plural values for i can be selected, that is, when a predetermined i in a range of 1 to imax (maximum of i) is selected and converted, this code word is a variable length code. This block encoded code is represented as a variable length code (d,k;m,n;r).

Here, "i" is referred to as a constraint length and imax is r (a maximum constraint length). "d" indicates, for example, a minimum number of consecutive "0" in repeated "1"s, that is, a minimum run of "0". "k" indicates a maximum number of consecutive "0" in repeated "1"s, that is, a maximum run of "0".

When the code word obtained as described above is recorded in the optical disk, the magneto-optical disk, or the like, for example, in a compact disc (CD) and a mini-disc (MD)®, NRZI (NonReturn to Zero Inverted) modulation, wherein "1" means inversion and "0" means non-inversion, is performed on a variable length code sequence. The code word is recorded on the basis of the NRZI modulated variable length code (hereinafter referred to as recorded waveform sequence). This is referred to as mark edge recording. On the other hand, in a magneto-optical disk or the like with a size of 3.5 inch and a capacity of 230 MB in the ISO standard, a code sequence recorded and modulated is directly recorded without being subjected to the NRZI modulation. This is referred to as mark position recording. In the present recording media having high recording density, the mark edge recording is often used.

If a minimum inversion interval of the recorded waveform sequence is Tmin and a maximum inversion interval is Tmax, to performing recording at high density in a linear velocity direction, the minimum inversion interval is desirably long, that is, the minimum run d is desirably large. From a clock reproduction aspect, the maximum inversion interval is desirably short, that is, the maximum run k is desirably small. When an overwrite characteristic is taken into account, Tmax/Tmin is desirably small. Moreover, from viewpoints of Jitter and S/N, it is important that a detection window width Tw=m/n is large. Various modulating methods have been proposed in view of conditions of media and put to practical use.

Specifically, examples of modulation systems proposed or actually used in optical disks, magnetic disks, magneto-optical disks, or the like are described. An EFM code (also represented as (2,10;8,17;1)) used in CDs and MDs, an 8-16 code (also represented as (2,10;1,2;1)) used in DVDs (Digital Versatile Discs), and an RLL(2,7) (also represented as (2,7;m,n;r)) used in PDs (120 mm and 650 MB) are RLL codes with the minimum run d=2. An RLL(1,7) (also represented as (1,7;2,3;r)) used in MD-DATA2 or a 3.5 inch MOs (640 MB) in the ISO standard is an RLL code with the minimum run d=1. Besides, in recording and reproducing disk devices such as optical disks and magneto-optical disks with high recording density, which are currently under research and development, an RLL code with the minimum run d=1 (Run Length Limited code) with well-balanced size of a minimum mark and conversion efficiency is often used.

A modulation table of the variable-length RLL(1,7) code is, for example, a table adopting a data pattern and a code pattern corresponding to the data pattern described below as conversion patterns.

TABLE 1

RLL(1,7):(d,k;m,n;r) = (1,7;2,3;2)

|  | Data Pattern | Code Pattern |
|---|---|---|
| i = 1 | 11 | 00x |
|  | 10 | 010 |
|  | 01 | 10x |
| i = 2 | 0011 | 000 00x |
|  | 0010 | 000 010 |
|  | 0001 | 100 00x |
|  | 0000 | 100 010 |

A sign x in this modulation table is set as "1" when a channel bit following the sign x is "0" and is set as "0" when a channel bit following the sign x is "1". The maximum constraint length r is 2.

A parameter of the variable length RLL(1,7) is (1,7;2,3,2). When a bit interval of a recording waveform sequence is T, the minimum inverting interval Tmin represented by (d+1)T is 2(=1+1)T. When a bit interval of a data row is Tdata, the minimum inverting interval Tmin represented by (m/n)×2 is 1.33(=(2/3)×2)Tdata. The maximum inverting interval Tmax represented by (k+1)T is Tmax=8(=7+1)T(=(m/n)×8Tdata=(2/3)×8Tdata=5.33Tdata). The detection window width Tw is represented by (m/n)×Tdata. A value of the detection window width Tw is 0.67(=2/3)Tdata.

In a channel bit string, which has been modulated by RLL(1,7) in Table 1, 2 T, which is the minimum run (Tmin), occurs most frequently. 3 T occurs less frequently than 2 T, 4 T occurs less frequently than 3 T, 5 T occurs less frequently than 4 T, and 6 T occurs less frequently than 5 T, and so on. When 2 T, which is the minimum run (Tmin), repeatedly occurs, that is, when edge information often occurs at an early period, this is advantageous for clock reproduction.

However, when the recording linear density is further increased, for example, in recording and play of the optical disk, the minimum run is a portion where an error tends to occur. This is because, at the time of disk play, a waveform output of the minimum run is smaller than those of other runs. The disk play is susceptible to, for example, defocus and tangential tilt. Moreover, recording and play with successive minimum marks at the high recording linear density is susceptible to disturbance such as noise as well. Therefore, a data reproduction error tends to occur. As a pattern of the data reproduction error in this case, all edges from a leading edge to a last edge of the successive minimum marks shift all at once to cause errors. In other words, a bit error length generated is propagated from the top to the last in a section of successive minimum runs. This causes a problem in that error propagation is long.

Consequently, for stabilization at the time when data is recorded and reproduced at high linear density, it is effective to limit the successive occurrence of minimum runs.

On the other hand, in recording of data in a recording medium or transmission of data, encoding modulation suitable for the recording medium or the transmission line is performed. When a low frequency component is included in modulation codes, for example, fluctuation in various error signals such as a tracking error in servo control of a disk device tends to occur or jitter tends to occur. Therefore, it is desirable that, in the modulation codes, the low frequency component is controlled as much as possible.

As a method of controlling the low frequency component, there is DSV (Digital Sum value) control. The DSV means a sum of codes at the time when a channel bit string is subjected to the NRZI modulation (i.e., converted into level codes) to be a recording code sequence and the "1" bits of the channel bit string (data symbols), that is, +1 codes, are added, whereas the "0" bits of the channel bit string, that is, −1 codes, are added. The DSV can serve to predict the low frequency component in the recording code sequence. To decrease the absolute value of fluctuation in plus and minus of the DSV, that is, to perform DSV control is to remove a direct-current component of the recording code sequence and control the low frequency component.

The modulation codes according to the variable length RLL(1,7) shown in Table 1 are not subjected to the DSV control. The DSV control in such a case is realized by performing DSV calculation at a predetermined interval in an encoded string (a channel bit string) after modulation and inserting predetermined DSV control bits in the encoded string (the channel bit string) (see, for example, JP-A-6-197024).

The number of DSV control bits to be inserted in the channel bit string depends on the minimum run d. At the time of d=1, when the DSV control bits are inserted in arbitrary positions in a code word to preserve the minimum run, a necessary number of bits is 2(=d+1) channel bits. When the DSV control bits are inserted in arbitrary positions in a code word to preserve the maximum run, necessary bits are 4(=2×(d+1)) channel bits. When the DSV control is performed with channel bits smaller in number than this, the DSV control may not be performed depending on patterns preceding and following the channel bits.

In the RLL(1,7) with (d,k;m,n)=(1,7;2,3), when the DSV control bits are converted into data by a conversion rate, the data is calculated as follows.

4 channel bits×2/3=8/3=2.67 data equivalent (2.67 Tdata)

Basically, the DSV control bits are redundant bits. Therefore, from the viewpoint of efficiency of code conversion, a smaller number of DSV control bits are better.

Moreover, it is preferable that the minimum run d and the maximum run k do not change because of the DSV control bits inserted. This is because, when (d,k) changes, recording and reproduction characteristics are affected.

However, in an actual RLL code, since the minimum run substantially affects the recording and reproduction characteristics, the minimum run should be preserved. However, the maximum run is not always preserved. In some formats, a pattern breaking the maximum run is used as a synchronization pattern. For example, although the maximum run in an 8-16 code of a DVD (Digital Versatile Disk) is 11 T, 14 T exceeding the maximum run is given in an synchronization pattern portion to improve detection ability of the synchronization pattern.

In view of the above, the inventors have proposed a 1,7 PP code in Table 2 before as a modulation system with (d,k)= (1,7) and corresponding to high recording density (see, for example, JP-A-11-346154).

TABLE 2

| 1,7PP:(d,k;m,n;r) = (1,7;2,3;4) | |
|---|---|
| Data Pattern | Code Pattern |
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| 110111 | 001 000 000 (next010) |
| 0001000 | 000 100 100 100 |
| 0000000 | 010 100 100 100 |

If xx1 then *0* = 000
xx0 then *0* = 101
Sync & Termination
01 001 000 000 001 000 000 001 (24 channel bits)
# = 0 not terminate case
# = 1 terminate case

| Termination table | |
|---|---|
| 00 | 000 |
| 0000 | 010 100 |
| 110111 | 001 000 000 (next010) |

When next channel bits are '010',
convert '11 01 11' to '001 000 000'.

A modulation table in Table 2 has, as conversion patterns, a basic pattern without which it is difficult to perform conversion processing (a conversion pattern including data patterns (11) to (000000)), a replacement pattern without which it is still possible to perform the conversion processing but with which more effective conversion processing is realized (a conversion pattern including data patterns (110111), (00001000), and (00000000)), and a termination pattern for terminating a data row in an arbitrary position (conversion patterns including data patterns (00) and (0000)).

In Table 2, the minimum run d=1, the maximum run k=7, and undetermined codes (codes represented by *) are included in elements of the basic pattern. The undetermined codes are determined as "0" or "1" to preserve the minimum run d and the maximum run k regardless of code word string immediately preceding or following the codes. In other words, in Table 2, when 2 bits of the data to be converted are (11), depending on a code word string (a channel bit string) immediately preceding the data, "000" or "101" is selected and the data is converted into "000" or "101". For example, when one channel bit of the code word string immediately preceding the 2-bit data is "1", the 2-bit data (11) is converted into a code word "000" to preserve the minimum run d. When one channel bit of the code word string immediately preceding the data is "0", the 2-bit data (11) is converted into a code word "101" to preserve the maximum run k.

The basic pattern in the modulation table in Table 2 has a variable-length structure. In other words, a basic pattern at the constraint length i=1 includes three items (*0*, 001, and 010) less than a necessary number 4 ($2^\wedge m = 2^\wedge 2 = 4$). As a result, in converting a data row, there is a data row that may not be converted only at the constraint length i. After all, in Table 2, it is necessary to refer to basic pattern up to the constraint length i=3 in order to convert all the data rows (to allow the modulation table to function as a modulation table).

The modulation table in Table 2 has the replacement pattern for limiting successive occurrence of the minimum run d. Thus, when a data row is (110111), a code word string following the data row is referred to. When the code word string is "010", this six-bit data is replaced with a code word "001 000 000". When the code word string following the data row is other than "010", the data row is converted into a code word in units of 2-bit data ((11), (01), (11)). Thus, the data is converted into a code word "*0* 010 *0*". Consequently, in the code word string obtained by converting the data, successive occurrence of the minimum run is limited to six times at the maximum.

In the modulation table in Table 2, the maximum constraint length r is 4. A conversion pattern with the constraint length i=4 includes a replacement pattern (a maximum run guarantee pattern) for realizing the maximum run k=7. In other words, the data pattern (00001000) is converted into a code pattern "000 100 100 100". The data pattern (00000000) is converted into a code pattern "010 100 100 100". Even in this case, the minimum run d=1 is preserved.

In Table 2, to insert the synchronization pattern, when the data row is terminated in an arbitrary position of the data pattern, the termination pattern is used in terminating the data row in (00) or (0000). In the synchronization pattern to be inserted, one code word at the top is an identification bit using the termination pattern. When the termination pattern is used, a leading code word of an immediately-following synchronization pattern is "1". When the termination pattern is not used, the leading code word is "0". The synchronization pattern in Table 2 includes the identification bit using the termination pattern and twenty-four code words in total, that is, code words obtained by repeating a code word of k=8 exceeding the maximum run k=7 twice to detect the synchronization pattern.

The conversion patterns in Table 2 have a conversion rule that, when the number of "1s" in elements of a data pattern and the number of "1s" in elements of a code pattern to be converted are divided by 2, the remainders are the same, either "1" or "0" (the number of "1s" is an odd number or an even number in both the elements corresponding to each other). For example, the data pattern (000001) among the conversion patterns corresponds to the code pattern "010 100 100". The number of "1s" in elements in the data pattern is one and the number of "1s" in the code pattern is three. When the number of "1s" in the data pattern and the number of "1s" in the code pattern are divided by 2, the remainders are the same 1 (odd number). Similarly, the data pattern (000000) among the conversion patterns corresponds to the code pattern "010 100 000". The number of "1s" in the data pattern is zero and the number of "1s" in the code pattern is two. When the number of "1s" in the data pattern and the number of "1s" in the code pattern are divided by 2, the remainders are the same 0 (even number).

A method of performing the DSV control will be explained. The DSV control in the past in the case in which the DSV control is not applied to the modulation table like the RLL(1,7) code in Table 1 is performed by, after modulating a data row, adding at least (d+1) DSV control bits to a channel bit string after modulation at a predetermined interval. Even in the modulation table shown in Table 2, it is possible to perform the DSV control as in the past. However, it is possible to more efficiently perform the DSV control by utilizing a relation between the data pattern and the code pattern to be converted in Table 2. In other word, when the modulation table has the conversion rule that, when the number of "1s" in elements of a data pattern and the number of "1s" in elements of a code pattern to be converted are divided by 2, the remainders are the same, either "1" or "0", inserting a DSV control bit "1" indicating "conversion" or a DSV control bit "0" indicating "non-conversion" in the channel bit string is equivalent to inserting a DSV control bit "1" in a data bit string to convert the data bit string or inserting a DSV control bit "0" in the data bit string not to convert the data bit string.

For example, in Table 2, when there are successive three "001" bits to be subjected to data conversion, if the DSV control bit is inserted behind the 3 bits, data is represented as (001-x) (x is one bit, "0" or "1"). If "0" is given to x, in the modulation table in Table 2, the following conversion is performed.

| Data Pattern | Code Pattern |
| --- | --- |
| 0010 | 010 000 |

If "1" is given, the following conversion is performed.

| Data Pattern | Code Pattern |
| --- | --- |
| 0011 | 010 100 |

When the code word string is subjected to NRZI modulation, the following level code string is generated.

| Data Pattern | Code Pattern | Level Code String |
| --- | --- | --- |
| 0010 | 010 000 | 011 111 |
| 0011 | 010 100 | 011 000 |

The last 3 bits of each level code are inverse to the last 3 bits of the other level code. This means that the DSV control can be performed in the data row by selecting either "1" or "0" for the DSV control bit x.

Considering the redundancy due to the DSV control, to perform DSV control on one bit in the data row is to perform the DSV control on 1.5 channel bits according to the conversion rate (m:n=2:3) in Table 2 if the bit is represented as a channel bit string. On the other hand, in order to perform the DSV control in the RLL(1,7) table shown in Table 1, it is necessary to perform the DSV control in the channel bit string. In this case, in order to preserve the minimum run, at least two channel bits are necessary. Compared with the DSV control in Table 2, the redundancy increases. In other words, when the modulation table as a table structure of Table 2, it is possible to efficiently perform the DSV control by performing the DSV control in the data row.

The modulation table in Table 2 having the minimum run and the maximum run of (d,k)=(1,7) and corresponding to high recording density explained above is adopted as a format in, for example, Blue-ray Disc Rewritable ver1.0™, which is a high-density optical disk system.

A more stable system is demanded in a modulation system to cope with higher recording density in future, more specifically, for example, a high density standard for high-density optical disks.

In that case, if a modulation system for realizing a more stable system with a parameter same as the (1,7)PP code in the past and a structure of a modulation table same as that in the past is realized for Blu-ray disc Rewritable ver1.0, which has already been commercialized, it is possible to divert the design technique in the past. Thus, it is possible to reduce design risks at the time of hardware designing.

As described above, when the RLL code is recorded and reproduced in a disk at high linear density, if there is a pattern with the successive minimum run d, a long error tends to occur. It is necessary to insert redundant bits to perform the DSV control in the (1,7;2,3) code. It is necessary to reduce the redundant bits as much as possible. Under such circumstances, the RLL code (d,k;m,n)=(1,7;2,3) with the minimum run d=1 is developed. In the RLL code, a modulation system for generating a more stable code string is demanded for the 1,7 PP code that has a characteristic that it is possible to perform the DSV control with highly efficient control bits while limiting the number of times of successive occurrence of the minimum run and preserving the minimum run and the maximum run. Specifically, for example, a modulation system for further reducing occurrence of errors due to edge shift is demanded.

Taking hardware designing into account, it is demanded that the modulation table should have a table structure same as the 1,7 PP code in the past.

It is desirable to, with a basic structure of a modulation table set to be the same as the 1,7 PP code, reduce the number of times of successive occurrence of the minimum run from that in the past without increasing a size of an apparatus and reduce occurrence of a long error at the time of recording and reproduction.

SUMMARY

According to an embodiment, there is provided a modulation table for converting data with a basic data length of m bits into a variable length code (d,k;m,n;r) (a maximum constraint length r>1) with a basic code word length of n bits, a minimum run of which is d (d>0) and a maximum run of which is k. The modulation table includes a basic table for converting data patterns including basic data with a basic data length of m bits into code patterns including a basic code of a variable length code with a basic code word length of n bits and a replacement table for replacing data patterns including replacement data with code patterns including a replacement code. The replacement table includes minimum-run-successive-occurrence limiting data patterns, which serve as the data patterns, for limiting the number of times of successive occurrence of the minimum run to N (N>1) or less and minimum-run-successive-occurrence limiting code patterns, which serves as the code patterns, corresponding to the minimum-run-successive-occurrence limiting data patterns. At least one of the minimum-run-successive-occurrence limiting code patterns includes an undetermined code, a value of which is determined according to an immediately-preceding or immediately-following code word string. A condition for determining whether the minimum-run-successive-occurrence limiting code pattern including the undetermined code is converted as a whole or divided and converted individually is defined by a data bit immediately following the minimum-run-successive-occurrence limiting data pattern corresponding to the minimum-run-successive-occurrence limiting code pattern including the undetermined code.

The condition is defined as a minimum-run-successive-occurrence limiting data pattern partially including a first minimum-run-successive-occurrence limiting data pattern, which is the minimum-run-successive-occurrence limiting data pattern corresponding the minimum-run-successive-occurrence limiting code pattern including the undetermined code, the minimum-run-successive-occurrence limiting data pattern being a second minimum-run-successive-occurrence limiting data pattern obtained by dividing the entire minimum-run-successive-occurrence limiting data pattern and individually converting the divided patterns.

A third minimum-run-successive-occurrence limiting data pattern included in the first minimum-run-successive-occurrence limiting data pattern is collectively converted into other replacement codes not including the undetermined code when the next three codes are "010".

The condition is defined as a data bit located immediately following the minimum-run-successive-occurrence limiting data pattern corresponding to the minimum-run-successive-occurrence limiting code pattern including the undetermined code.

The minimum-run-successive-occurrence limiting code pattern including the undetermined code can include, in limiting successive occurrence of the minimum run at d=1, a code word "$0$" including an undetermined code "$" that is "0" when immediately-preceding three codes are "010" and is "1" when the immediately-preceding three codes are not "010".

The code word "$0$" can be set to "000" when an immediately-preceding code is "1".

The number of times of successive occurrence N of the minimum run can be set to five times or less.

According to another embodiment, there is provided a modulating apparatus that converts data with a basic data length of m bits into a variable length code (d,k;m,n;r) (a maximum constraint length r>1) with a basic code word length of n bits, a minimum run of which is d and a maximum run of which is k. The modulating apparatus includes first converting means for collectively converting portions of input data coinciding with a first minimum-run-successive-occurrence limiting data pattern for limiting the number of times of successive occurrence of the minimum run to N (N>1) or less into a first minimum-run-successive-occurrence limiting code pattern including an undetermined code that corresponds to the first minimum-run-successive-occurrence limiting data pattern, deciding means for deciding the undetermined code, second converting means for individually converting portions of the input data coinciding with partial data patterns forming a part of the first minimum-run-successive-occurrence limiting data pattern into code patterns corresponding to the portions, detecting means for detecting a condition in collectively converting the first minimum-run-successive-occurrence limiting data pattern into the first minimum-run-successive-occurrence limiting code pattern from data bits forming the input data, and selecting means for selecting, when it is detected that the input data satisfies the condition, the first minimum-run-successive-occurrence limiting code pattern that is collectively converted and includes the undetermined code decided and selecting, when it is detected that the input data does not satisfy the condition, the code patterns obtained by individually converting the first-minimum-run-successive-occurrence limiting data pattern for each of the partial data patterns.

The selecting means can judge that the condition is satisfied when the input data includes a portion coinciding with the first minimum-run-successive-occurrence limiting data pattern and a data bit immediately following the coinciding portion is not a predetermined data bit set in advance.

The modulating apparatus further includes an RLL information generating means that generates information for preserving an RLL rule and limitation-information generating means that generates information for limiting the number of times of successive occurrence of the minimum run to N or less. The deciding means can decide the undetermined code on the basis of the information for preserving the RLL rule generated and the information for limiting the number of times of successive occurrence of the minimum run to N or less generated.

The modulating apparatus further includes third converting means that collectively converts portions of input date coinciding with a second minimum-run-successive-occurrence limiting data pattern forming data patterns of a part of the first minimum-run-successive-occurrence limiting data pattern into a second minimum-run-successive-occurrence limiting code pattern different from the first minimum-run-successive-occurrence limiting code pattern. The selecting means can select the second minimum-run-successive-occurrence limiting code pattern when three codes following the second minimum-run-successive-occurrence limiting data pattern are "010".

The modulating apparatus can further include storing means for storing at least 12-bit data among the input data.

The first converting means can limit the number of times of successive occurrence of the minimum run to five or less.

It is possible to record a signal modulated by the modulating apparatus in a recording medium.

According to still another embodiment, there is provided a modulating method, a program, or a recording medium having the program recorded therein for converting data with a basic data length of m bits into a variable length code (d,k;m,n;r) (a maximum constraint length r>1) with a basic code word length of n bits, a minimum run of which is d and a maximum run of which is k. The modulating method, the program, or the recording medium having the program recorded therein includes the steps of collectively converting portions of input data coinciding with a minimum-run-successive-occurrence limiting data pattern for limiting the number of times of successive occurrence of the minimum run to N (N>1) or less into a minimum-run-successive-occurrence limiting code pattern including an undetermined code that corresponds to the minimum-run-successive-occurrence limiting data pattern, deciding the undetermined code, individually converting portions of the input data coinciding with partial data patterns forming a part of the minimum-run-successive-occurrence limiting data pattern into code patterns corresponding to the portions, detecting a condition in collectively converting the minimum-run-successive-occurrence limiting data pattern into the minimum-run-successive-occurrence limiting code pattern from including the undetermined code data bits forming the input data, and selecting, when it is detected that the input data satisfies the condition, the minimum-run-successive-occurrence limiting code pattern that is collectively converted and includes the undetermined code decided and selecting, when it is detected that the input data does not satisfy the condition, the code patterns obtained by individually converting the minimum-run-successive-occurrence limiting data pattern for each of the partial data patterns.

According to still another embodiment, there is provided a replacement table including minimum-run-successive-occurrence limiting data patterns for limiting the number of successive occurrence of a minimum run to N (N is an integer larger than 1) or less and minimum-run-successive-occurrence limiting code patterns corresponding the minimum-run-successive-occurrence limiting data patterns. At least one of the minimum-run-successive-occurrence limiting code patterns includes an undetermined code, a value of which is determined according to an immediately-preceding or immediately-following code word string. A condition for determining whether the minimum-run-successive-occurrence limiting code pattern including the undetermined code is converted as a whole or divided and converted individually is defined by a data bit immediately following the minimum-run-successive-occurrence limiting data pattern corresponding to the minimum-run-successive-occurrence limiting code pattern including the undetermined code.

According to an embodiment, a condition in collectively converting a first minimum-run-successive-occurrence limiting data pattern into a first minimum-run-successive-occurrence-limiting code pattern including an undetermined code is detected from data bits forming input data. When it is detected that the input data satisfies the condition, the first minimum-run-successive-occurrence limiting data pattern is collectively converted and the first minimum-run-successive-occurrence limiting code pattern including the undetermined code decided is selected and, when it is detected that the input data does not satisfy the condition, code patterns obtained by individually converting the minimum-run-successive-occurrence limiting data pattern for each of partial data patterns are selected.

According to the embodiments, it is possible to reduce successive occurrence of the minimum run and reduce propagation of an error at the time of recording and reproduction of data while preventing an increase in size of an apparatus. It is also possible to perform a rapid processing.

Additional features and advantages are described herein, and will be apparent from, the following Detailed Description and the figures.

DETAILED DESCRIPTION

Figure 1:
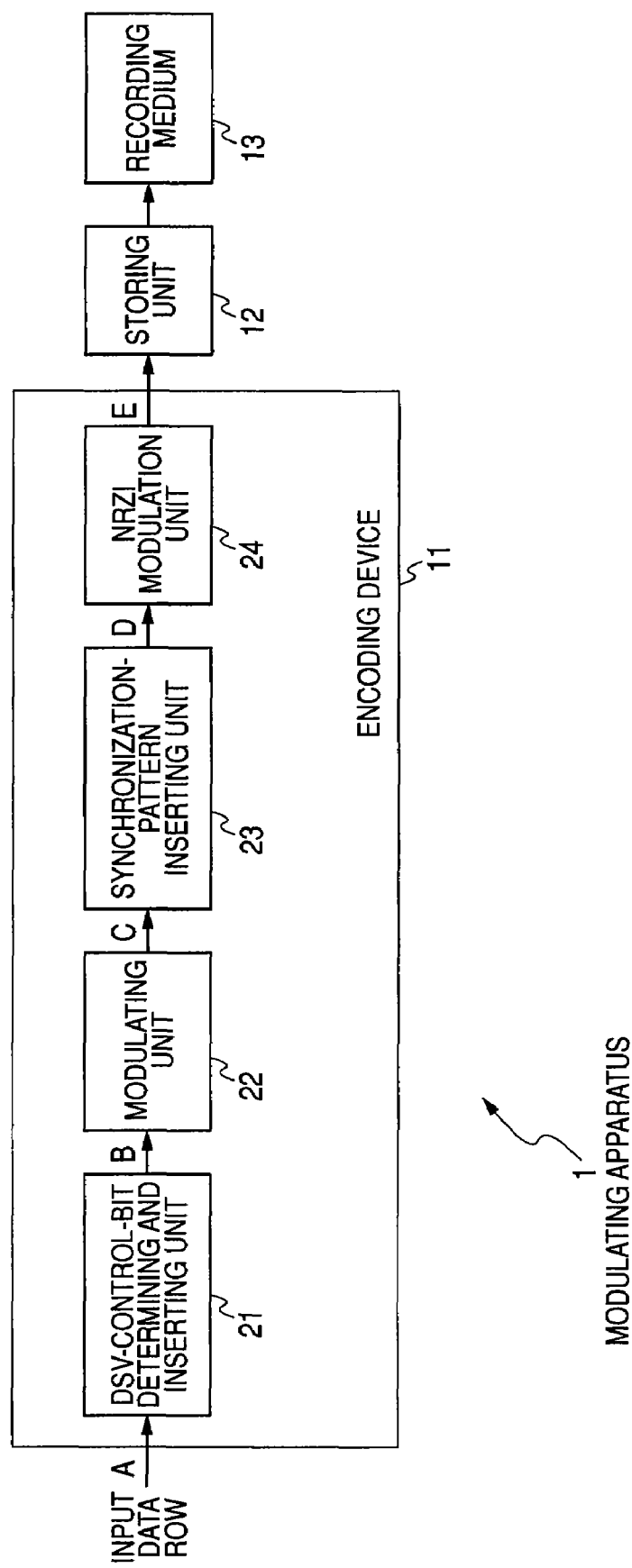
FIG. 1 is a block diagram showing a structure of a modulating apparatus according to an embodiment.

Embodiments are hereinafter explained.

According to an embodiment, there is provided a modulation table (e.g., the modulation table in Table 3) for converting data with a basic data length of m bits into a variable length code (d,k;m,n;r) (a maximum constraint length r>1) with a basic code word length of n bits, a minimum run of which is d (d>0) and a maximum run of which is k. The modulation table includes a basic table (e.g., a portion of a range of data patterns (11) to (000000) on the upper side of Table 3) for converting data patterns (e.g., data patterns (11) to (000000) on the left side of Table 3) including basic data with a basic data length of m bits into code patterns (e.g., code patterns "*0*" to "010 100 000" on the right side of Table 3) including a basic code of a variable length code with a basic code word length of n bits and a replacement table (e.g., a range of data patterns (00001000) to (100111011101) on the lower side of Table 3) for replacing data patterns (data patterns (00001000) to (100111011101) on the left side of Table 3) including replacement data with code patterns (code patterns (000 100 100 100) to (001) (no-change) on the right side of Table 3) including a replacement code. The replacement table includes minimum-run-successive-occurrence limiting data patterns (e.g., (110111) (next "010"), (1001110111), and (100111011101) in Table 3), which serve as the data patterns, for limiting the number of times of successive occurrence of the minimum run to N (N>1) or less and minimum-run-successive-occurrence limiting code patterns (e.g., code patterns "001 000 000", "$0$010 000 000 101", and "001 (no-change)" in Table 3), which serves as the code patterns, corresponding to the minimum-run-successive-occurrence limiting data patterns. At least one of the minimum-run-successive-occurrence limiting code patterns includes an undetermined code (e.g., "$" in Table 3), a value of which is determined according to an immediately-preceding or immediately-following code word string. A condition for determining whether the minimum-run-successive-occurrence limiting code pattern (e.g., a code pattern "$0$010 000 000 101" in Table 3) including the undetermined code is converted as a whole or divided and converted individually is defined by a data bit (e.g., a 2-bit data (01) in the last of (100111011101) in Table 3 or a data bit (01) located immediately following a data pattern (1001110111) in Table 4) immediately following the minimum-run-successive-occurrence limiting data pattern (e.g., (1001110111) in Table 3) corresponding to the minimum-run-successive-occurrence limiting code pattern including the undetermined code.

The condition is defined as a minimum-run-successive-occurrence limiting data pattern partially including a first minimum-run-successive-occurrence limiting data pattern (e.g., (1001110111) in Table 3), which is the minimum-run-successive-occurrence limiting data pattern corresponding the minimum-run-successive-occurrence limiting code pattern (e.g., the code pattern "$0$010 000 000 101" in Table 3) including the undetermined code, the minimum-run-successive-occurrence limiting data pattern being a second minimum-run-successive-occurrence limiting data pattern (e.g., (100111011101) in Table 3) obtained by dividing the entire minimum-run-successive-occurrence limiting data pattern and individually converting the divided patterns.

A third minimum-run-successive-occurrence limiting data pattern (e.g., (110111) in Table 3) included in the first minimum-run-successive-occurrence limiting data pattern (e.g., (1001110111) in Table 3) can be collectively converted into other replacement codes (e.g., "001 000 000" in Table 3) not including the undetermined code when the next three codes are "010".

The condition can be a modulation table defined as a data bit (e.g., (not01) of (100111011(not01) in Table 4) located immediately following the minimum-run-successive-occurrence limiting data pattern corresponding to the minimum-run-successive-occurrence limiting code pattern including the undetermined code.

Figure 12:
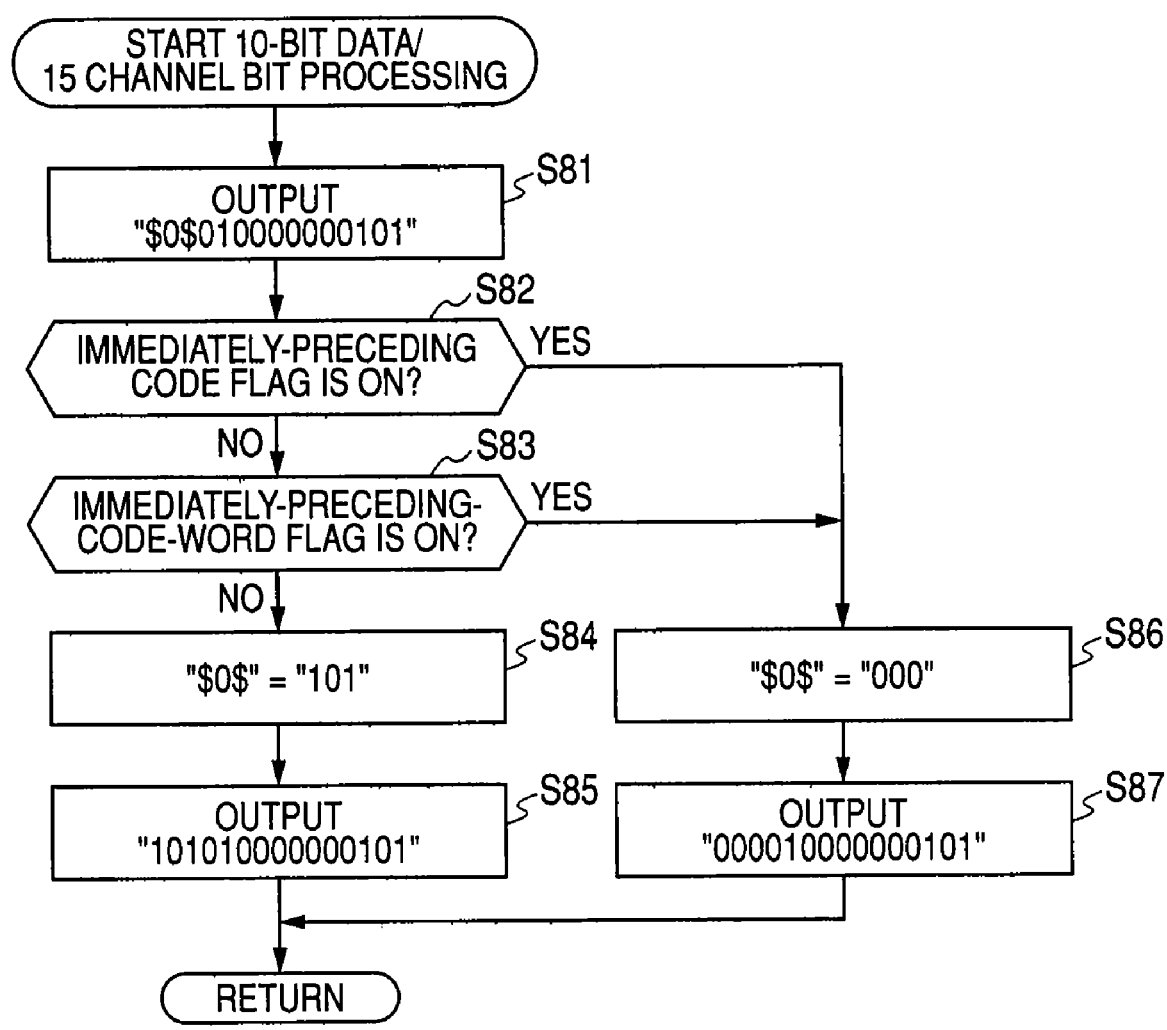
FIG. 12 is a flowchart for explaining 10-bit data/15 channel bit processing in step S54 in FIG. 11.

The minimum-run-successive-occurrence limiting code pattern including the undetermined code can include, in limiting successive occurrence of the minimum run at d=1, a code word "$0$" including an undetermined code "$" that is "0" (e.g., step S86 in FIG. 12) when immediately-preceding three codes are "010" (e.g., when it is judged in step S83 in FIG. 12 that an immediately-preceding-cord-ward flag is on) and is "1" (e.g., step S84 in FIG. 12) when the immediately-preceding three codes are not "010" (e.g., it is judged in step S83 in FIG. 12 that the immediately-preceding-code-word flag is not on).

The code word "$0$" can be set to "000" (e.g., step S86 in FIG. 12) when an immediately-preceding code is "1" (e.g., when it is judged in step S82 in FIG. 12 that an immediately-preceding-code flag is on).

According to another embodiment of the invention, there is provided a modulating apparatus (e.g., a modulating apparatus 1 in FIG. 1) that converts data with a basic data length of m bits into a variable length code (d,k;m,n;r) (a maximum constraint length r>1) with a basic code word length of n bits, a minimum run of which is d and a maximum run of which is k. The modulating apparatus includes first converting means (e.g., a minimum-run-successive-occurrence limiting table 92B in FIG. 4) that collectively converts portions of input data coinciding with a first minimum-run-successive-occurrence limiting data pattern (e.g., (1001110111) in Table 3) for limiting the number of times of successive occurrence of the minimum run to N (N>1) or less into a first minimum-run-successive-occurrence limiting code pattern (e.g., the code pattern "$0$010 000 000 101" in Table 3) including an undetermined code that corresponds to the first minimum-run-successive-occurrence limiting data pattern, deciding means (e.g., an undetermined-bit determining unit 93 in FIG. 4) that decides the undetermined code, second converting means (e.g., a conversion table 72 in FIG. 4) that individually converts portions of the input data coinciding with partial data patterns forming a part of the first minimum-run-successive-occurrence limiting data pattern into code patterns corresponding to the portions, detecting means (e.g., a minimum-run-successive-occurrence-limitation-data detecting unit 91 or a minimum-run-successive-occurrence-limitation-data detecting and predicting unit 81 in FIG. 4) that detects a condition in collectively converting the first minimum-run-successive-occurrence limiting data pattern into the first minimum-run-successive-occurrence limiting code pattern from data bits forming the input data, and selecting means (e.g., a conversion-pattern determining unit 53 in FIG. 4) that selects, when it is detected that the input data satisfies the condition (e.g., when it is judged in step S231 in FIG. 17 that a minimum-run-successive-occurrence-limitation-data detection flag (10-bit data) is on and it is judged in step S232 that a prediction flag is not on), the first minimum-run-successive-occurrence limiting code pattern that is collectively converted and includes the undetermined code decided (e.g., step S233 in FIG. 17) and selects, when it is detected that the input data does not satisfy the condition (e.g., when it is judged in step S231 in FIG. 17 that the minimum-run-successive-occurrence-limitation-data detection flag (10-bit data) is not on or when it is judged in step S232 that the prediction flag is on), the code patterns obtained by individually converting the first-minimum-run-successive-occurrence limiting data pattern for each of the partial data patterns (e.g., steps S236 to S245 in FIG. 17).

Figure 17:
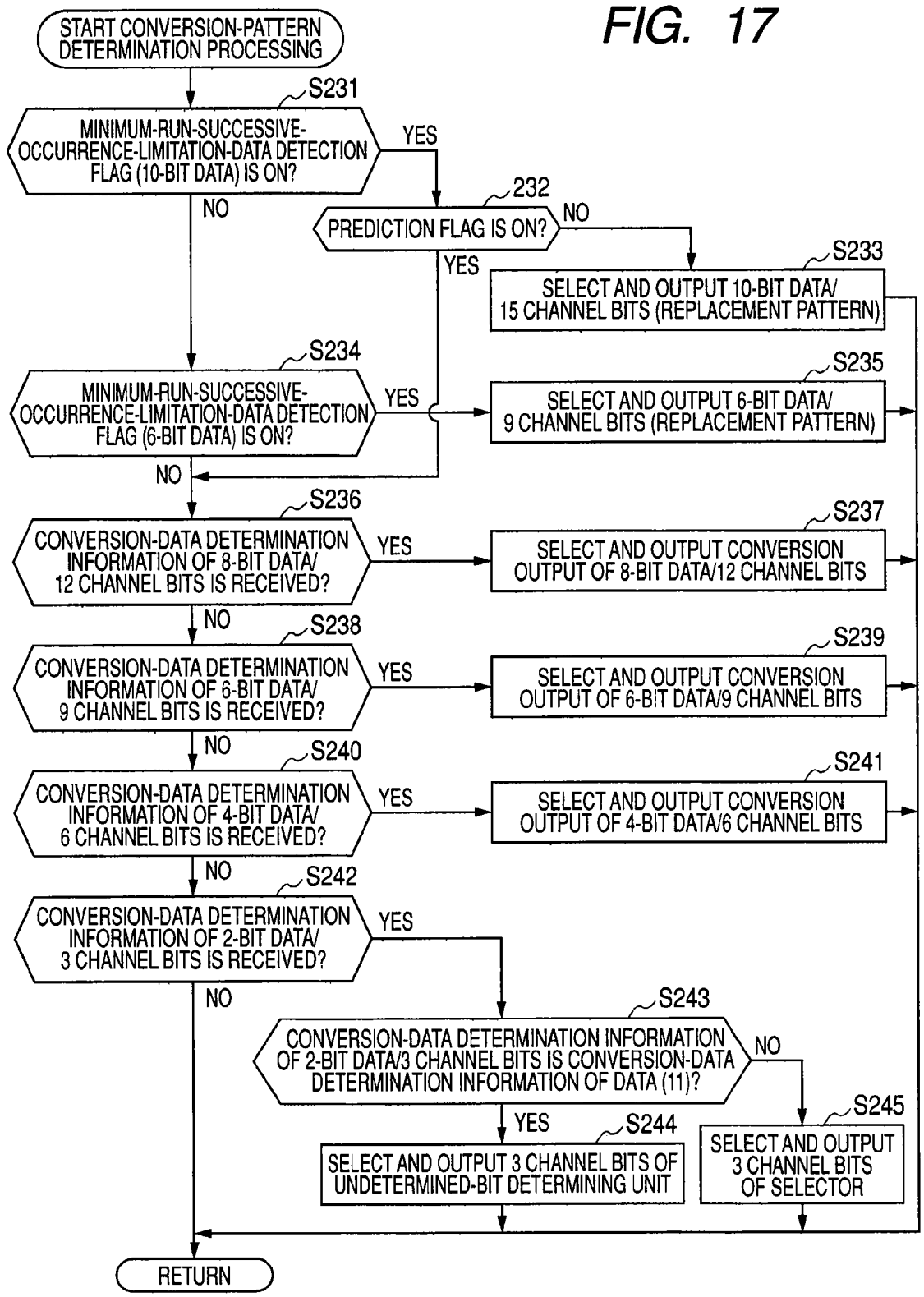
FIG. 17 is a flowchart for explaining conversion-pattern determination processing in step S6 in FIG. 9.

The selecting means can judge that the condition is satisfied when the input data includes a portion coinciding with the first minimum-run-successive-occurrence limiting data pattern (e.g., it is judged in step S231 in FIG. 17 that the minimum-run-successive-occurrence-limitation-data detecting flag (10-bit data) is on) and a data bit immediately following the coinciding portion is not a predetermined data bit set in advance (e.g., when it is judged in step S232 in FIG. 17 that the prediction flag is not on).

Figure 15:
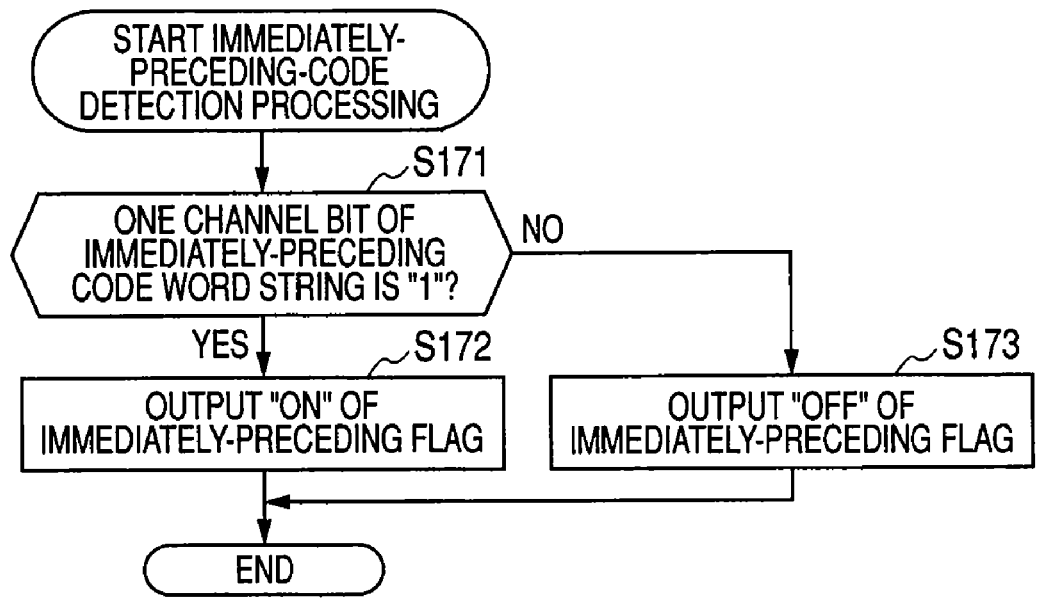
FIG. 15 is a flowchart for explaining immediately-preceding-code detection processing.
Figure 16:
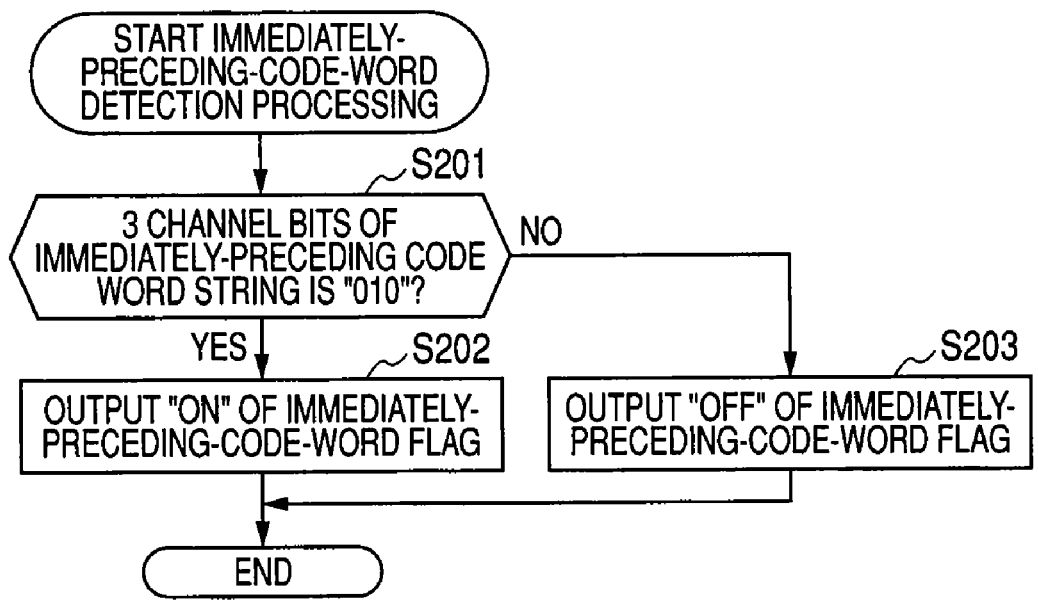
FIG. 16 is a flowchart for explaining immediately-preceding-code-word detection processing.

The modulating apparatus further includes RLL information generating means (e.g., an immediately-preceding-code detecting unit 54 in FIG. 4 that executes processing in steps S171 to S173 in FIG. 15) that generates information for preserving an RLL rule (e.g., an immediately-preceding code flag that is set on when an immediately-preceding channel bit string is "1" and is set off when the immediately-preceding channel bit string is "0") and limitation-information generating means (e.g., an immediately-preceding-code-word detecting unit 55 that executes processing in steps S201 to S203 in FIG. 16) that generates information for limiting the number of times of successive occurrence of the minimum run to N or less (e.g., an immediately-preceding-code-word flag that is set on when immediately-preceding three channel bits are "010" and is set off when the immediately-preceding three channel bits are not "010"). The deciding means can decide the undetermined code on the basis of the information for preserving the RLL rule generated and the information for limiting the number of times of successive occurrence of the minimum run to N or less generated (e.g., processing in steps S82, S83, S84, and S86 in FIG. 12).

Figure 4:
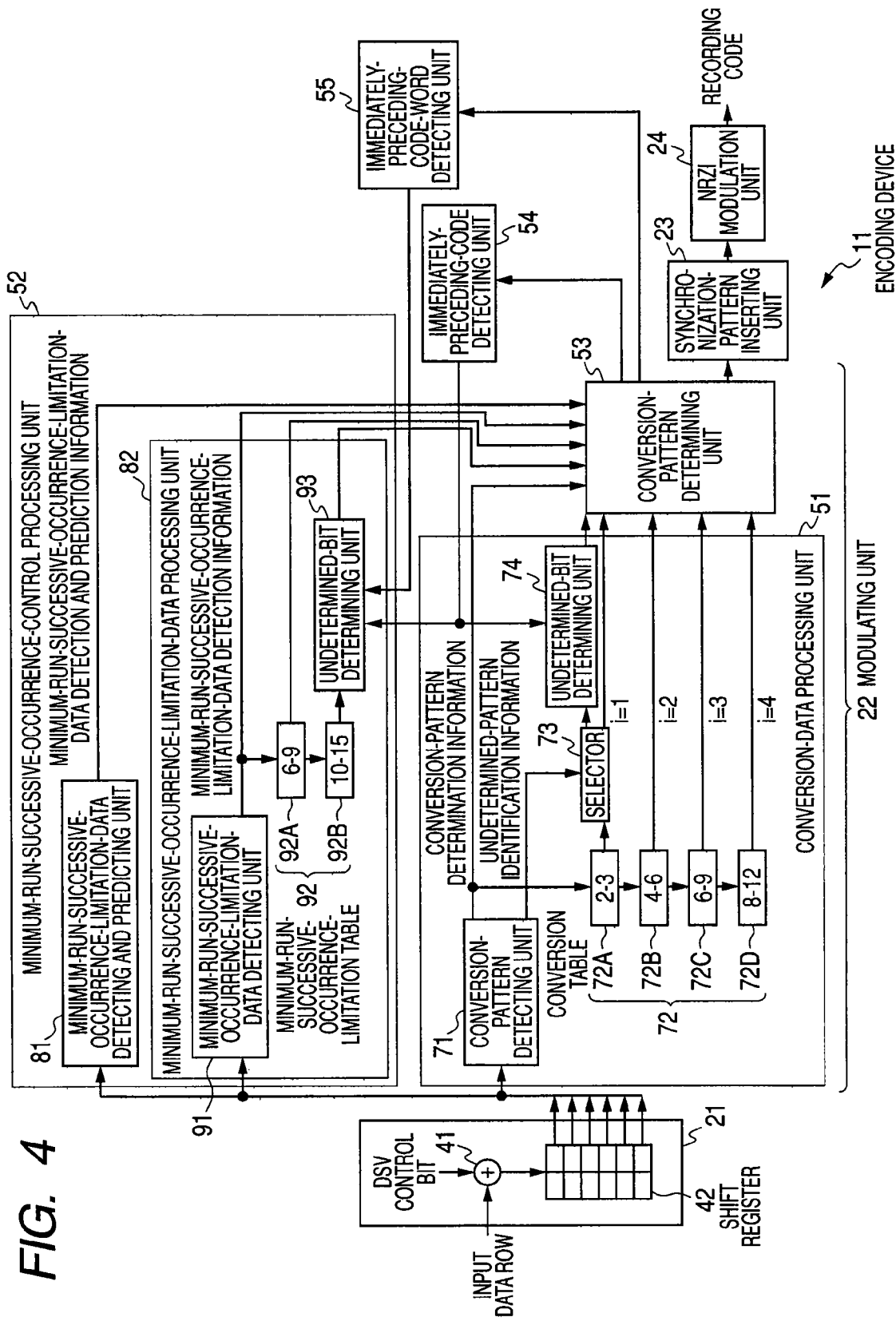
FIG. 4 is a block diagram showing a more detailed structure of the encoding device in FIG. 3.

The modulating apparatus further includes third converting means (e.g., a minimum-run-successive-occurrence limitation tale 92A in FIG. 4) that collectively converts portions of input data coinciding with a second minimum-run-successive-occurrence limiting data pattern (e.g., (110111) in Table 3) forming data patterns of a part of the first minimum-run-successive-occurrence limiting data pattern (e.g., (1001110111) in Table 3) into a second minimum-run-successive-occurrence limiting code pattern (e.g., "001 000 000" in Table 3) different from the first minimum-run-successive-occurrence limiting code pattern. The selecting means can select the second minimum-run-successive-occurrence limiting code pattern when three codes following the second minimum-run-successive-occurrence limiting data pattern are "010" (e.g., when it is judged in step S234 in FIG. 17 that a minimum-run-successive-occurrence-limitation-data detection flag (6d010) is on) (e.g., step S235 in FIG. 17).

The modulating apparatus can further include storing means (e.g., a shift register 42 in FIG. 4) that stores at least 12-bit data among the input data.

It is possible to record a signal modulated by the modulating apparatus (e.g., the modulating apparatus 1 in FIG. 1) in a recording medium (e.g., a recording medium 13 in FIG. 1).

According to still another embodiment, there is provided a modulating method (e.g., a modulating method for the modulating apparatus 1 in FIG. 1) for converting data with a basic data length of m bits into a variable length code (d,k;m,n;r) (a maximum constraint length r>1) with a basic code word length of n bits, a minimum run of which is d and a maximum run of which is k. The modulating method includes the steps of collectively converting portions of input data coinciding with a minimum-run-successive-occurrence limiting data pattern (e.g., (1001110111) in Table 3) for limiting the number of times of successive occurrence of the minimum run to N (N>1) or less into a minimum-run-successive-occurrence limiting code pattern (e.g., "0$010 000 000 101" in Table 3) including an undetermined code that corresponds to the minimum-run-successive-occurrence limiting data pattern (e.g., step s81 in FIG. 12), deciding the undetermined code (e.g., steps S84 and S86 in FIG. 12), individually converting portions of the input data coinciding with partial data patterns forming a part of the minimum-run-successive-occurrence limiting data pattern into code patterns corresponding to the portions (e.g., step S5 in FIG. 9), detecting a condition in collectively converting the minimum-run-successive-occurrence limiting data pattern into the minimum-run-successive-occurrence limiting code pattern from including the undetermined code data bits forming the input data (e.g., steps S31 to S33 in FIG. 10 or steps S52 and S53 in FIG. 11), and selecting, when it is detected that the input data satisfies the condition (e.g., it is judged in step S231 in FIG. 17 that the minimum-run-successive-occurrence-limitation-data detection flag (10-bit data) is on and it is judges in step S232 that the prediction flag is not on), the minimum-run-successive-occurrence limiting code pattern that is collectively converted and includes the undetermined code decided (e.g., step S233 in FIG. 17) and selecting, when it is detected that the input data does not satisfy the condition (e.g., when it is judged in step S231 in FIG. 17 that the minimum-run-successive-occurrence-limitation-data detection flag (10-bit data) is not on or when it is judged in step S232 that the prediction flag is on), the code patterns obtained by individually converting the minimum-run-successive-occurrence limiting data pattern for each of the partial data patterns (e.g., steps S236 to S245 in FIG. 17).

Embodiments of the invention will be hereinafter explained with reference to the drawings. In the following explanation, a data pattern before conversion is represented by marking off the data pattern with parentheses in such a manner as (000011) and a channel bit string (a code pattern) after conversion is represented by marking off the channel bit string with quotation marks in such a manner as "000 100 100". In this specification, a 1,7 PP code (PP: Parity-preserve Prohibit-repeated-minimum-transition-runlength) means a variable length code with a minimum run d=1, a maximum run k=7, and a conversion rate (m:n)=(2:3) and means a code having a modulation table (a conversion table) for limiting the number of times the minimum run successive and performing complete DSV control with efficient DSV control bits while preserving the maximum run and the maximum run.

Table 3 below represents a modulation table according to an embodiment.

TABLE 3

1,7PP-rmtr5_code.Rev.1 RLL(1,7;2,3;5)
17pp-rmtr5_ver.1

| | Data Pattern | Code Pattern |
|---|---|---|
| i = 1 | 11 | *0* |
| | 10 | 001 |
| | 01 | 010 |
| i = 2 | 0011 | 010 100 |
| | 0010 | 010 000 |
| | 0001 | 000 100 |
| i = 3 | 000011 | 000 100 100 |
| | 000010 | 000 100 000 |
| | 000001 | 010 100 100 |
| | 000000 | 010 100 000 |
| i = 4 | 00001000 | 000 100 100 100 |
| | 00000000 | 010 100 100 100 |
| i = 3 | 110111(next "010") | 001 000 000 |
| i = 5 | 1001110111 | $0$ 010 000 000 101 |
| i = 6 | 100111011101 | 001 (no-change) | if xx1 then *0* = 000
xx0 then *0* = 101
if x10 or x01 then $0$ = 000
x00 $0$ = 101
Sync & Termination
01 010 000 000 010 000 000 010 (24 cbits)
# = 0 not terminate case
# = 1 terminate case Termination table

| 00 | 000 |
|---|---|
| 0000 | 010 100 |

The code pattern "001" (no-change) means not to collectively convert the data pattern (100111011101), that is, not to divide the data pattern (100111011101) into individual data and convert the respective data (in other words, the data pattern (1001110111) means that, when a data bit immediately following the data pattern is (01), the data pattern is not collectively converted into the code pattern "$0$010 000 000 101" but is divided into and converted individually). Specifically, a leading data (10) of the data pattern (100111011101) is converted into "001" in first conversion processing. In the next conversion processing, the next data (01) is converted into "010". Similarly, the next data (110111) (next "010") and the next data (01) are sequentially converted in to "001 000 000" and "010", respectively. "001" in "001" (no-change) represents a code word of conversion in the first time.

Portions with the constraint length i=5 and 6 in Table 3 is equivalent to a case in which it is defined that the data pattern (1001110111) is converted into the code pattern "$0$010 000 000 101" when a data bit located immediately following the data pattern is not (01) (is a data bit other than (01)).

TABLE 4

| | Data Pattern | Code Pattern |
|---|---|---|
| i = 5 | 1001110111 (not01) | $0$ 010 000 000 101 |

The modulation table in Table 3 has conversion patterns including a data pattern and a code pattern in the same manner as the modulation table in Table 1 or Table 2. When the modulating apparatus performs modulation in accordance with the modulation table in Table 3, if a data row inputted to the modulating apparatus coincides with the data pattern described in Table 3, a portion of the data row coinciding with the data pattern is converted into a code pattern corresponding thereto and outputted as a code word string.

The modulation table in Table 3 is the 1,7 PP code and has a basic structure same as Table 2. The modulation table in Table 3 includes a basic table, a replacement table, and a termination table.

The basic table has a conversion pattern (a basic pattern) without which it is difficult to perform conversion processing. The replacement table has a conversion pattern (a replacement pattern) without which it is still possible to perform the conversion processing but with which it is possible to realize more effective conversion processing (limit the maximum run or limit successive occurrence of the minimum run). The termination table has a conversion pattern (a termination pattern) for terminating a code in an arbitrary position.

Specifically, in the modulation table shown in Table 3, a portion having a conversion pattern (a basic pattern) including a basic data pattern, which includes data patterns from (11) to (000000), and a basic code pattern, which includes code patterns from "*0*" to "010 100 000" corresponding to the data patterns, is a modulation table serving as the basic table. A portion having a conversion pattern (a replacement pattern) including a replacement data pattern, which includes data patterns of (00001000), (00000000), (110111) (next "010"), (1001110111), and (100111011101), and a replacement code pattern, which includes code patterns of "000 100 100 100", "010 100 100 100", "001 000 000", "$0$010 000 000 101", and "001" (no-change) corresponding to the data patterns, is a modulation table serving as the replacement table.

In the replacement table, a portion including a replacement pattern, which includes data patterns of (00001000) and (00000000), and a replacement code pattern, which includes code patterns of "000 100 100 100" and "010 100 100 100" corresponding to the data patterns, is a table of a replacement pattern for limiting the maximum run. A portion including a replacement data pattern, which includes data patterns of (110111), (next "010"), (1001110111), and (100111011101), and a replacement code pattern, which includes code patterns of "001 000 000", "$0$010 000 000 101", and "001" (no-change) corresponding to the data patterns, is a table of a replacement pattern for limiting successive occurrence of the minimum run (a minimum-run-successive-occurrence limiting pattern).

A portion having a conversion pattern (a termination pattern) including a termination data pattern, which includes data patterns of (00) and (0000), and a terminal code pattern, which includes code patterns of "000" and "010 100", is a modulation table serving as a termination table.

The data patterns from (11) to (00000000) are fixedly converted into code patterns corresponding thereto from "*0*" to "010 100 100 100" regardless of a condition. In that regard, these conversion patterns are also described as fixed conversion patterns.

On the other hand, the data patterns of (110111) and (next "010") are collectively converted into a code pattern of "001 000 000" depending on a condition (when the next channel bits are "010"). However, depending on a condition (when the next channel bits are not "010"), the data patterns are not collectively converted but are dissolved into individual data patterns (fixed conversion patterns). Each of the data patterns is converted into a code pattern corresponding thereto. In that regard, the data patterns are also described as conditional conversion patterns.

The modulation table describes a correspondence relation between the data patterns and the code patterns. In the following explanation, a part of Table 3 is also described as a modulation table or a conversion table if necessary.

Table 3 has, with the minimum run d=1 and the maximum run k=7, an undetermined code (a code represented by a sign *) in elements of a basic code. The undetermined code is determined to be "0" or "1" to preserve the minimum run d and the maximum run k. In other words, in Table 3, when 2-bit data to be converted is (11), depending on a code word string (a channel bit string) immediately preceding the data, "000" or "101" is selected and the data is converted into "000" or "101". For example, when one channel bit (code) of the code word string immediately preceding the 2-bit data is "1", the 2-bit data (11) is converted into a code word "000" to preserve the minimum run d. When one channel bit of the code word string immediately preceding the data is "0", the 2-bit data (11) is converted into a code word "101" to preserve the maximum run k.

Since the modulation pattern in Table 3 has a variable-length structure, the basic pattern has conversion patterns from i=1 to i=3.

The modulation table in Table 3 has, at the constraint length i=3, a replacement pattern for limiting successive occurrence of the minimum run d. When a data row coincides with the data pattern (110111), a code word immediately following the data pattern is further referred to. When a code word string (channel bits) following the data pattern is "010", the 6-bit data (110111) is collectively replaced with a code word "001 000 000". When the immediately-following code word string is not "010" (when the code word string is "001", "101", or "000", this data pattern is divided into 2-bit data units ((11), (01), and (11)) and converted into a code word. Thus, the data pattern is converted into a code word "*0* 010 *0*", that is, a code word "*0* 010 101".

The modulation table in Table 3 separately has, at the constraint length i=5, a replacement pattern for limiting successive occurrence of the minimum run d. When a data row coincides with the data pattern (1001110111), except exceptional processing described later (processing at the time when the following data is (01)), 10 bits of this data row are replaced with the code word "$0$010 000 000 101". "$" of the code word "$0$" is an undetermined code for preserving the RLL rule and limiting the number of times of successive occurrence of the minimum run to a predetermined number of times. Specifically, when one channel bit of an immediately-preceding code word string is "1", in order to preserve the minimum run, the code word "$0$" is converted into the code word "000". On the other hand, When the one channel bit of the immediately-preceding code word string is "0", in order to preserve the maximum run and limit the number of times of successive occurrence of the minimum run to the predetermined number of times, when three channel bits of the immediately-preceding code word string are "010", the code word "$0$" is converted into the code word "000" and, when the immediately-preceding three channel bits are not "010", the code word "$0$" is converted into the code word "101".

In this embodiment, the undetermined code $ is decided on the basis of a value of an immediately-preceding code. However, depending on a position of the undetermined code $, it is also possible to decide the undetermined code $ according to an immediately-following code.

The above description can also be represented as follows in summary. When two channel bits of the immediately-preceding code word string are "10" or "01", "$0$" is replaced with the code word "000". When the two channel bits are neither "10" nor "01", that is, when the two channel bits are "00", "$0$" is converted into the code word "101". There are four kinds of patterns of the two channel bits. Since the remaining "11" does not satisfy the minimum run d=1, the two channel bit does not defined as a conversion pattern.

The exceptional processing is as described below. When a data row is (1001110111), immediately-following data is further referred to. When the following data is (01) (after all, data is (100111011101), the replacement processing described above is not performed and only leading 2 bits (10) are converted into the code word "001".

In processing in the next time, the data (01) is converted into the code pattern "010". In the next processing, the data (110111) (next "010") is converted into the code pattern "001 000 000".

Consequently, in the code word string with the data converted, successive occurrence of the minimum run is limited and the minimum run is repeated five times at the maximum.

The modulation table in Table 3 has, in a conversion pattern with the constraint length i=4, a replacement pattern for realizing the maximum run k=7 (a maximum run guarantee pattern). In other words, the data (00001000) is converted into the code word (000 100 100 100) and the data (00000000) is converted into the code "010 100 100 100". Even in this case, the minimum run d=1 is preserved.

In Table 3, in terminating a data row in an arbitrary position thereof in order to insert a synchronization pattern, when the data row is terminated in a position of (00) or (0000), the termination pattern is used. In the synchronization pattern to be inserted, one leading code is a termination-pattern-use identification bit. When the termination pattern is used, a leading code of an immediately-following synchronization pattern string is "1". When the termination pattern is not used, the leading code is "0". The synchronization pattern in Table 3 has the termination-pattern-use identification bit and, for detection of the synchronization pattern, a code word of k=8 exceeding the maximum run k=7 such that a last code is "0". For example, as shown in Table 3, k=8 is repeated twice to constitute the synchronization pattern with 24 codes (channel bits) in total.

The conversion patterns in Table 3 have a conversion rule that, when the number of "1s" in elements of a data pattern and the number of "1s" in elements of a code pattern to be converted are divided by 2, the remainders are the same, either "1" or "0" (the number of "1s" is an odd number or an even number in both the elements corresponding to each other). For example, the data pattern (000001) among the conversion patterns corresponds to the code pattern "010

100 100". The number of "1s" in elements in the data pattern is one and the number of "1s" in the code pattern is three. When the number of "1s" in the data pattern and the number of "1s" in the code pattern are divided by 2, the remainders are the same 1 (odd number). Similarly, the data pattern (000000) among the conversion patterns corresponds to the code pattern "010 100 000". The number of "1s" in the data pattern is zero and the number of "1s" in the code pattern is two. When the number of "1s" in the data pattern and the number of "1s" in the code pattern are divided by 2, the remainders are the same 0 (even number).

After all, DSV polarities are stored for data patterns and channel bit stings in the respective conversion patterns. Thus, in the data row, when one DSV control bit is inserted as a redundant bit and this DSV control bit is (1), if a data row including a DSV control bit portion is converted into a channel bit string and subjected to NRZI modulation to create a recording code string, the polarities are inverted. When the DSV control bit is (0), if the data row including the DSV control bit portion is converted into a cannel bit string and subjected to NRZI modulation to create a recording code string, the polarities are not inverted. Therefore, the modulation table in which the DSV polarities are stored is subjected to data conversion by the one bit inserted as the redundant bit in the data row to make it possible to change the polarities after the data row is subjected to NRZI modulation. Thus, it is possible to perform DSV control in the data row.

A maximum data pattern to be referred to for conversion is in the following case in Table 3.

| Data Pattern | Code Pattern |
|---|---|
| 100111011101 | 001 (no-change) |

In order to judge from a data row whether a data pattern following the data pattern (1001110111) is (01), a data row following (1001110111) (10 bits) to be referred to is (01) (2 bits) at the maximum. Thus, 12 bits are referred to in total.

Therefore, compared with the case in which the conversion patterns in this portion in Table 3 are described, for example, as described below,

| Data Pattern | Code pattern |
|---|---|
| 1001110111 (next "010") | 001 (no-change) | it is possible to reduce a size and cost of the shift register 42 (an apparatus) in FIG. 4 described later. It is also possible to quickly judge whether input data coincides with a data pattern.

When Table 3 is described as above, it is necessary to judge whether a code word string following the data pattern (1001110111) is "010". For the judgment, a data row following (1001110111) (10 bits) to be referred to is (00000) (5 bits) at the maximum. 15 bits are referred to in total. Therefore, a size and cost of the shift register (the apparatus) is increased compared with the case in which the conversion patterns are described as shown in Table 3. This increases time for judging whether the input data coincides with the data pattern.

A structure of the modulating apparatus according to the embodiment of the invention will be explained with reference to the drawings. FIG. 1 is a block diagram showing an overall structure of the modulating apparatus 1 according to the embodiment. The modulating apparatus 1 includes an encoding device 11 that encodes an inputted data row and outputs the data row and a recording unit 12 that records the output of the encoding device 11 in the recording medium 13. The encoding device 11 includes a DVD-control-bit determining and inserting unit 21, a modulating unit 22, a synchronization-pattern inserting unit 23, and an NRZI modulation unit 24.

The DSV-control-bit determining and inserting unit 21 applies DSV control to the inputted data row at an arbitrary interval in accordance with a predetermined format. As a result, the DSV-control-bit determining and inserting unit 21 determines "1" or "0" serving as a DSV control bit at the arbitrary interval and inserts "1" or "0" in the data row. The modulating unit 22 modulates the data row in which the DSV control bit is inserted. The synchronization-pattern inserting unit 23 inserts the synchronization pattern in a predetermined position at the predetermined interval. The NRZI modulation unit 24 converts the data, in which the synchronization pattern is inserted, into a recording code string (or converts the data into a transmission code string when the data is outputted to a transmission line). The recording unit 12 records the recording code string inputted by the NRZI modulation unit 24 in the recording medium 13 constituted by an optical disk, a magnetic disk, a magneto-optical disk, or the like. Although not shown in the figure, the modulating apparatus 1 includes a timing managing unit that supplies a timing signal to the respective units and manages timing.

Figure 2:
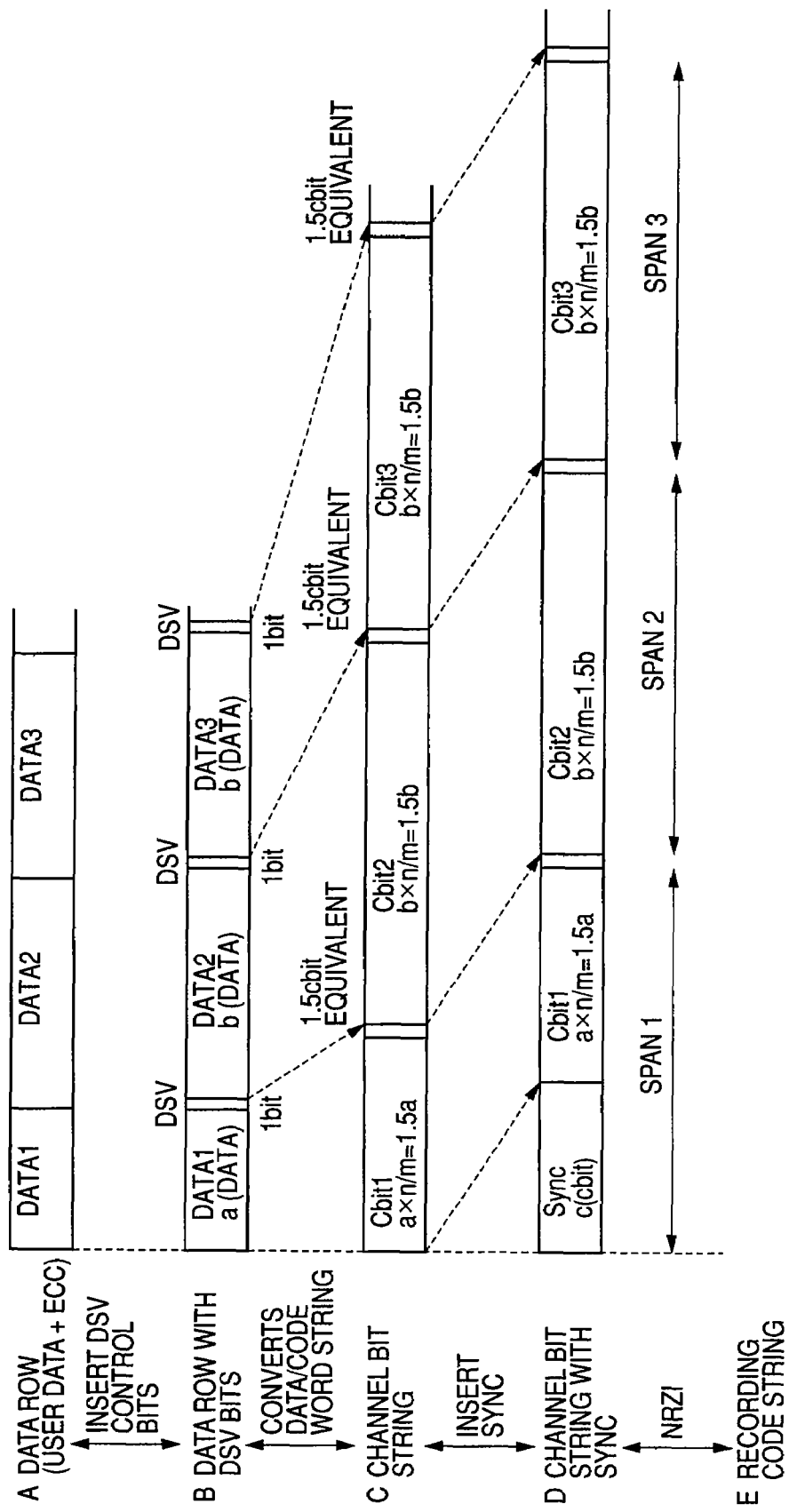
FIG. 2 is a diagram for explaining a data format.

FIG. 2 is a diagram showing a data format of data inputted to and outputted from the respective units of the modulating apparatus 1. A relation of insertion of DSV control bits including the synchronization pattern is shown in the figure. Besides user data, information data such as an ECC (Error-Correcting Code) is included in a data row (A in FIG. 2) inputted to the DSV-control-bit determining and inserting unit 21 from a not-shown apparatus. The DSV-control-bit determining and inserting unit 21 inserts one DSV control bit in a position of a predetermined interval of this data row (B in FIG. 2). A leading section is set to length different from those of other sections in advance on the premise that SYNC (a synchronization pattern) is inserted therein. When lengths of DSV sections (DATA1, DATA2, and DATA3) in B in FIG. 2 are a data, b data, and b data, respectively, a conversion cbit (channel bit) section of the respective DSV sections (DATA1, DATA2, and DATA3) is (a×3/2)=(1.5a) or (b×3/2)=(1.5b) according to modulation by the modulating unit 22 in which the modulation table (Table 3) with the conversion rate m:n=2:3 (C in FIG. 2). Thereafter, the synchronization-pattern inserting unit 23 inserts SYNC in a predetermined position (in FIG. 2, a leading position preceding the DATA1 position) (D in FIG. 2). When the number of channel bits of SYNC is c(cbit), a relation of Equation (1) below is established among a, b, and c.

$$1.5a+c=1.5b \qquad (1)$$

In this case, the DSV control is also performed at the equal interval in the format including the synchronization pattern.

The DSV control bit in the channel bit in FIG. 2 is equivalent to 1.5 channel bits. In other words, since the one DSV control bit is inserted in the data row, the DSV control bit is increased by the conversion rate in a channel-bit equivalent number of bits as indicated by Equation (2) below.

$$1 \text{ bit} \times n/m = 1 \times 3/2 = 1.5 \text{ channel bits} \quad (2)$$

Compared with the system in the past, in this system, for example, in order to perform the DSV control in the channel bit while preserving the minimum run d=1, two channel bits are necessary. In order to perform the DSV control while preserving both the minimum run and the maximum run, 4 channel bits are necessary. Therefore, compared with the DSV control system in the past, insertion of the DSV control bits in the data row according to this system can be performed with a fewer number of redundant channel bits for the DSV control.

The channel bit string in which the synchronization pattern is inserted is subjected to NRZI modulation by the NRZI modulation unit 24 (E in FIG. 2), supplied to the recording unit 12 as a recording code string, and recorded in the recording medium 13.

Figure 3:
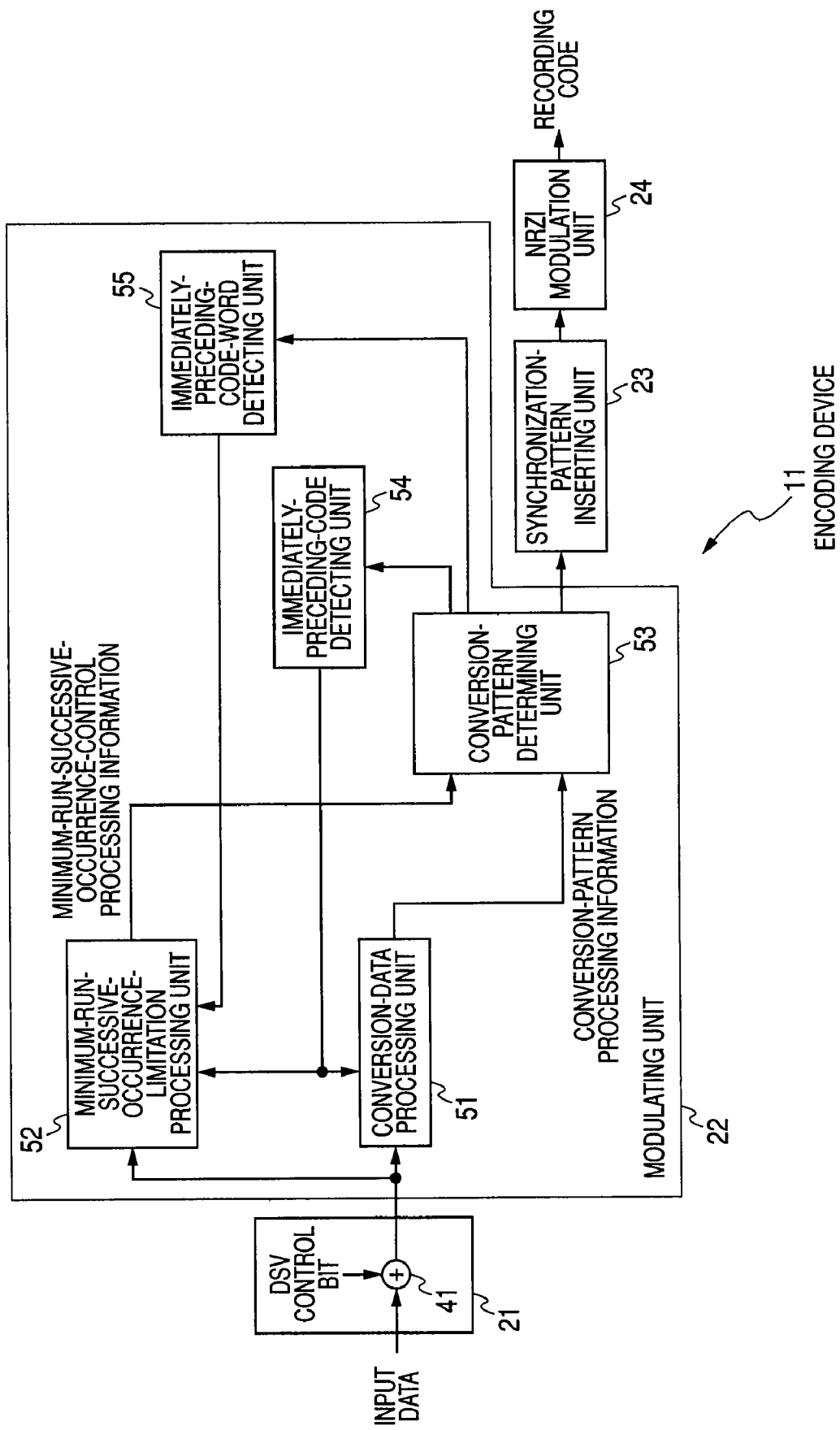
FIG. 3 is a block diagram showing a more detailed structure of an encoding device in FIG. 1.

FIG. 3 is a block diagram showing a more detailed structure of a main section of the encoding device 11. The DSV-control-bit determining and inserting unit 21 has an adder 41 that adds the DSV control bits to the input data. The modulating unit 22 includes a conversion-data processing unit 51, a minimum-run-successive-occurrence-limitation processing unit 52, a conversion-pattern determining unit 53, an immediately-preceding-code detecting unit 54, and an immediately-preceding-code-word detecting unit 55.

The adder 41 inserts the DSV control bits in the data row inputted at a predetermined interval. The input data row in which the DSV control bits are inserted is sent to the conversion-data processing unit 51 and the minimum-run-successive-occurrence-limitation processing unit 52. The conversion-data processing unit 51 has the basic pattern in Table 3 and a replacement pattern for realizing the minimum run k=7. The conversion-data processing unit 51 performs conversion data processing to preserve the RLL rule and supplies information on the processing to the conversion-pattern determining unit 53. Information from the immediately-preceding-code detecting unit 54 is used for this conversion data processing. The conversion-data processing unit 51 has a termination table for inserting a synchronization pattern. The conversion-data processing unit 51 uses the termination table, if necessary, to terminate the data row in a predetermined position. When the termination table is used, information on the termination table is embedded in the synchronization pattern.

The minimum-run-successive-occurrence-limitation processing unit 52 has the replacement pattern for limiting successive occurrence of the minimum run d in Table 3. The minimum-run-successive-occurrence-limitation processing unit 52 performs processing to limit the number of times of successive occurrence of the minimum run to a predetermined number of times and supplies information on the processing to the conversion-pattern determining unit 53. Information from the immediately-preceding-code detecting unit 54 and information from the immediately-preceding-code-word detecting unit 55 are used for this processing. The conversion-pattern determining unit 53 selects a conversion pattern finally decided from information from the conversion-data processing unit 51 and information from the minimum-run-successive-occurrence-limitation processing unit 52 and outputs a code word string of the conversion pattern. The synchronization pattern is inserted in predetermined positions at a predetermined interval by the synchronization-pattern inserting unit 23. For determination of the synchronization pattern, termination table processing information outputted from the conversion-data processing unit 51 is used if necessary. An output of the synchronization-pattern inserting unit 23 is subjected to NRZI modulation in the NRZI modulation unit 24 and outputted as a recording code string (or outputted to the transmission line as a transmission code string).

The immediately-preceding-code detecting unit 54 detects a code of one channel bit immediately preceding processing object data as information necessary for guaranteeing RLL from the conversion pattern finally decided by the conversion-pattern determining unit 53. The immediately-preceding-code detecting unit 54 supplies a result of the detection to the conversion-data processing unit 51 and the minimum-run-successive-occurrence-limitation processing unit 52. The immediately-preceding-code-word detecting unit 55 detects a code word of a minimum unit immediately preceding the processing object data as information necessary for guaranteeing the number of times of limitation of successive occurrence of the minimum run. The immediately-preceding-code-word detecting unit 55 supplies a result of the detection to the minimum-run-successive-occurrence-limitation processing unit 52.

Timing for operations of the respective units is managed in synchronization with a timing signal supplied from a not-shown timing managing unit.

FIG. 4 is a block diagram showing a more detailed structure of a main section of the encoding device 11 in FIG. 3. The shift register 42 that holds maximum 12 bits of outputs of the adder 41 in units of 2 bits is provided in the DSV-control-bit determining and inserting unit 21. An output of the shift register 42 is outputted to the conversion-data processing unit 51 and the minimum-run-successive-occurrence-limitation processing unit 52.

The conversion-data processing unit 51 includes a conversion-pattern detecting unit 71, conversion tables (modulation tables) 72A to 72D, a selector 73, and an undetermined-bit determining unit 74.

The minimum-run-successive-occurrence-limitation processing unit 52 includes a minimum-run-successive-occurrence-limitation-data detecting and predicting unit 81 and a minimum-run-successive-occurrence-limitation-data processing unit 82. The minimum-run-successive-occurrence-limitation-data processing unit 82 includes a minimum-run-successive-occurrence-limitation-data detecting unit 91, minimum-run-successive-occurrence limitation tables (modulation tables) 92A and 92B, and an undetermined-bit determining unit 93.

The adder 41 inserts the DSV control bits in the inputted data row at the predetermined interval. The input data row in which the DSV control bits are inserted is sequentially shifted by one data at a time in the shift register 42 and arranged in units of 2-bit data serving as processing units. The data row in 2-data units is supplied in parallel to the conversion-pattern detecting unit 71, the minimum-run-successive-occurrence-limitation-data detecting and predicting unit 81, and the minimum-run-successive-occurrence-limitation-data detecting unit 91 by the number of bits necessary for the respective units to perform processing of the units.

Since Table 3 is used as the modulation table, a maximum value of the number of reference bits necessary for the respective units to perform the processing is twelve. Since the processing is performed in units of 2 bits, the shift register 42 holds 12 bits.

The conversion-pattern detecting unit 71 detects a conversion pattern for preserving the RLL rule from the data row inputted from the shift register 42. The conversion-pattern detecting unit 71 outputs information on a result of the detection (conversion-pattern determination information) to the conversion-pattern determining unit 53 and also outputs the information to the respective conversion tables 72A to 72D. The conversion table 72A performs conversion processing with the constraint length i=1. In other words, the conversion table 72A converts 2-bit data into three channel bits and outputs the three channel bits to the selector 73. The conversion table 72B performs conversion processing with the constraint length i=2. In other words, the conversion table 72B converts 4-bit data into 6 channel bits and outputs the 6 channel bits to the conversion-pattern determining unit 53. The conversion table 72C performs conversion processing with the constraint length i=3. In other words, the conversion table 72C converts 6-bit data into 9 channel bits and outputs the 9 channel bits to the conversion-pattern determining unit 53. The conversion table 72D performs conversion processing with the constraint length i=4. In other words, the conversion table 72D converts 8-bit data into twelve channel bits and outputs the twelve channel bits to the conversion-pattern determining unit 53. When the conversion-pattern detecting unit 71 detects an undetermined data corresponding to an undetermined code, the conversion-pattern detecting unit 71 outputs undetermined-pattern identification information to the selector 73.

When the undetermined code is included in a channel bit string supplied from the conversion table 72A (when the undetermined-pattern identification information indicates presence of the undetermined code), the selector 73 outputs the channel bit string supplied from the conversion table 72A to the undetermined-bit determining unit 74 on the basis of the undetermined-pattern identification information from the conversion-pattern detecting unit 71.

The undetermined-bit determining unit 74 decides an undetermined bit included in the three channel bits supplied from the selector 73 on the basis of the output of the immediately-preceding-code detecting unit 54. The undetermined-bit determining unit 74 outputs a code string of the three channel bits after the undetermined bit is decided. On the other hand, when the undetermined code is not included, the selector 73 directly outputs the channel bit string supplied from the conversion table 72A to the conversion-pattern determining unit 53.

The conversion-data processing unit 51 has a termination table for inserting a synchronization pattern and uses the termination table, if necessary, to terminate the data row in a predetermined position. When the termination table is used, information on the termination table is embedded in the synchronization pattern.

The minimum-run-successive-occurrence-limitation-data detecting unit 91 detects a conversion pattern for limiting the number of times of successive occurrence of the minimum run in the data row supplied from the shift register 42. Then, the minimum-run-successive-occurrence-limitation-data detecting unit 91 outputs information on the detection to the conversion-pattern determining unit 53 as minimum-run-successive-occurrence-limitation-data detection information and also outputs the information to the respective minimum-run-successive-occurrence limitation tables 92A and 92B. The minimum-run-successive-occurrence limitation table 92A performs processing for converting 6-bit data into 9 channel bits on the basis of the minimum-run-successive-occurrence-limitation-data detection information supplied from the minimum-run-successive-occurrence-limitation-data detecting unit 91. the minimum-run-successive-occurrence limitation table 92A outputs a code string of the 9 channel bits to the conversion-pattern determining unit 53. The minimum-run-successive-occurrence limitation table 92B converts 10-bit data into 15 channel bits on the basis of the minimum-run-successive-occurrence-limitation-data detection information and outputs the 15 channel bits to the undetermined-bit determining unit 93. The undetermined-bit determining unit 93 decides an undetermined bit included in the 15 channel bits supplied from the minimum-run-successive-occurrence limitation table 92B on the basis of the outputs of the immediately-preceding-code detecting unit 54 and the immediately-preceding-code-word detecting unit 55. The undetermined-bit determining unit 93 outputs a code string of the 15 channel bits after the undetermined bit is decided to the conversion-pattern determining unit 53.

The minimum-run-successive-occurrence-limitation-data detecting and predicting unit 81 detects a predetermined conversion pattern among conversion patterns for limiting the number of times of successive occurrence of the minimum run in a predetermined position not at the top (a position in the middle) of the data row inputted from the shift register 42. Then, the minimum-run-successive-occurrence-limitation-data detecting and predicting unit 81 outputs information on the detection to the conversion-pattern determining unit 53 as minimum-run-successive-occurrence-limitation-data detection and prediction information.

The conversion-pattern determining unit 53 determines (selects) one channel bit string (conversion pattern) from the channel bit strings inputted from the conversion tables 72A to 72D and the minimum-run-successive-occurrence limitation tables 92A and 92B using the information from the conversion-pattern detecting unit 71, the minimum-run-successive-occurrence-limitation-data detecting unit 91, and the minimum-run-successive-occurrence-limitation-data detecting and predicting unit 81 and outputs the channel bit string to the synchronization-pattern inserting unit 23. The synchronization-pattern inserting unit 23 inserts a synchronization pattern in predetermined positions of the conversion pattern string, which is determined by the conversion-pattern determining unit 53, at a predetermined interval and outputs the conversion pattern string. The synchronization-pattern inserting unit 23 determines the synchronization pattern using the information on the terminal table processing generated by the conversion-data processing unit 51 and obtained via the conversion-pattern determining unit 53. The NRZI modulation unit 24 subjects the channel bit string in which the synchronization pattern is inserted to NRZI modulation and outputs the channel bit string as a recording code string (or a transmission code string when the channel bit string is outputted to the transmission line).

The immediately-preceding-code detecting unit 54 detects a channel bit immediately preceding the next conversion processing from the conversion pattern finally decided by the conversion-pattern determining unit 53 as information necessary for guaranteeing RLL. The immediately-preceding-code detecting unit 54 supplies a result of the detection (an immediately-preceding code flag) to the undetermined-bit determining unit 74 in the conversion-data processing unit 51 and the undetermined-bit determining unit 93 in the minimum-run-successive-occurrence-limitation processing unit 52. The immediately-preceding-code-word detecting unit 55 detects a code word of a minimum unit immediately preceding the next conversion processing from the conversion pattern finally decided by the conversion-pattern determining unit 53 as information necessary for guaranteeing the number of times of successive occurrence limitation of the minimum run. The immediately-preceding-code-word detecting unit 55 supplies a result of the detection (an immediately-preceding-code-word flag) to the undetermined-bit determining unit 93 in the minimum-run-successive-occurrence-limitation processing unit 52.

Timing of operations of the respective units is managed in synchronization with a timing signal supplied from the not-shown timing managing unit.

Correspondence between FIG. 4 and Table 3 is described as follows. The minimum-run-successive-occurrence-limitation-data detecting unit 91 operates when the input data row is (110111) and the following channel bit string is "010" or when the input data row is (1001110111) in Table 3. The minimum-run-successive-occurrence-limitation-data detecting and predicting unit 81 operates when fifth and subsequent data of the input data row is (110111) and the following 2-bit data is (01) in Table 3.

Figure 5:
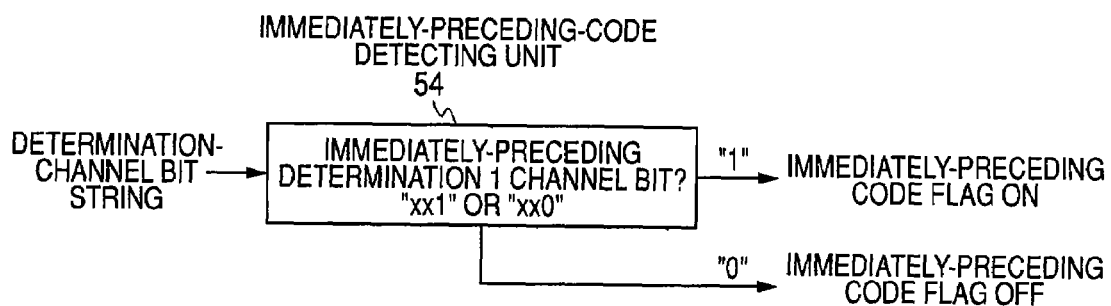
FIG. 5 is a diagram for explaining a function of an immediately-preceding-code detecting unit.
Figure 6:
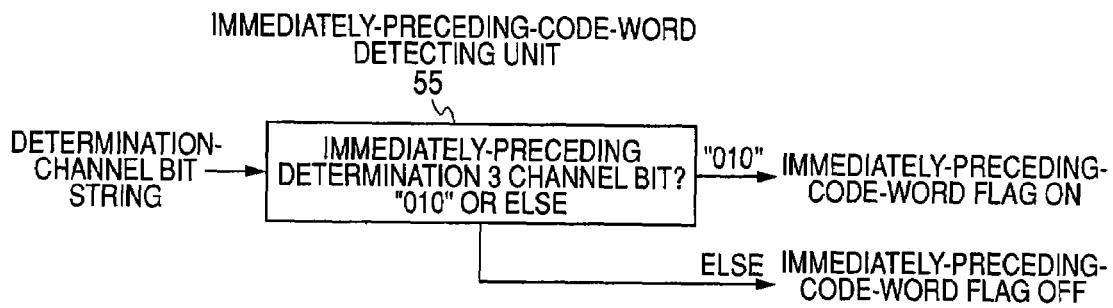
FIG. 6 is a diagram for explaining a function of an immediately-preceding-code-word detecting unit.
Figure 7:
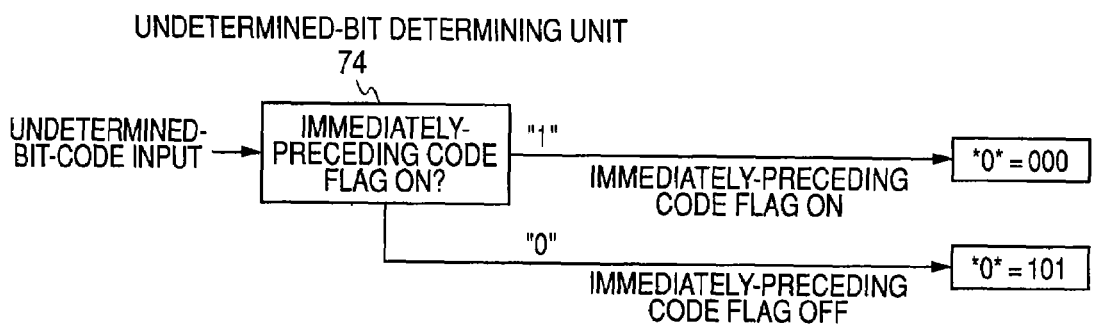
FIG. 7 is a diagram for explaining a function of an undetermined-bit determining unit of a converted-data processing unit.

As shown in FIG. 5, the immediately-preceding-code detecting unit 54 stores a last channel bit string of the conversion pattern (the channel bit string) determined and outputs information indicating whether the conversion pattern is "1" or "0" (an immediately-receding code flag). As shown in FIG. 6, the immediately-preceding-code-word detecting unit 55 stores a second channel bit from the last of the conversion pattern (the channel bit string) determined and outputs information indicating whether the conversion pattern is "1" or "0" (an immediately-preceding-code-word flag). Alternatively, the immediately-preceding-code-word detecting unit 55 stores three channel bits from the last together with the characteristic of the minimum run d=1 and outputs information indicating whether the three channel bits are "010" (an immediately-preceding-code-word flag). As shown in FIG. 7, the undetermined-bit determining unit 74 is equivalent to the table for converting the input data pattern (11) into "*0*" in Table 3. When an immediately-preceding channel bit is "1" (when the immediately-preceding code flag is on), "000" is outputted. When the immediately-preceding channel bit is "0" (when the immediately-preceding code flag is off), "101" is outputted.

Figure 8:
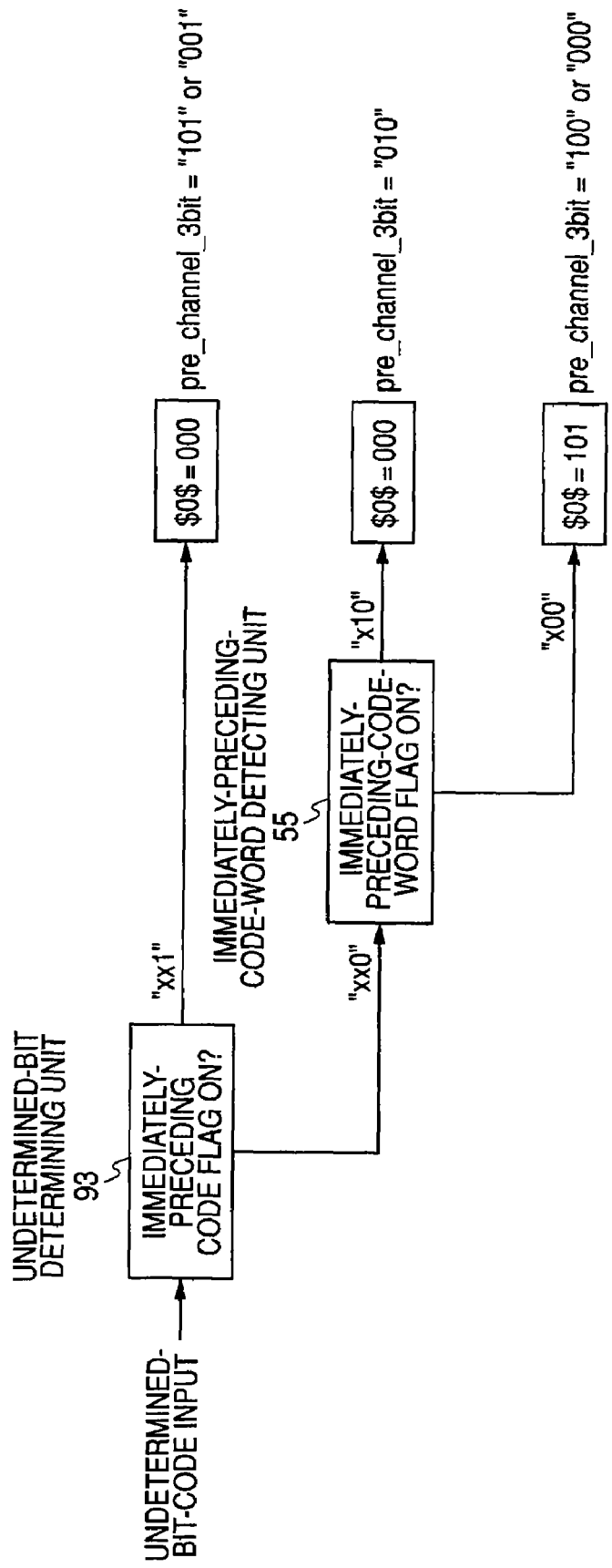
FIG. 8 is a diagram for explaining a function of an undetermined-bit determining unit of a minimum-run-successive-occurrence-limitation processing unit.

As shown in FIG. 8, the undetermined-bit determining unit 93 is equivalent to the table for replacing the input data pattern (1001110111) with the replacement code "$0$010 000 000 101" in Table 3. When an immediately-preceding code is "1" (when the immediately-preceding code flag is on) or when an immediately-preceding code word is "010" (when the immediately-preceding-code-word flag is on) even if the immediately-preceding code is "0", the undetermined code "$0$" is set as "000". When the immediately-preceding code word is not "010" (when the immediately-preceding-code-word flag is off), the undetermined code "$0$" is set as "101". In other words, a replacement code "000 010 000 000 101" is outputted when immediately-preceding two channel bits are "10" or "01" and a replacement code "101 010 000 000 101" is outputted when the immediately-preceding two channel bits are "00".

The correspondence between FIG. 4 and Table 3 is further explained. When the outputs from the conversion tables 72A to 72D and the outputs from the minimum-run-successive-occurrence limitation tables 92A and 93A overlap each other, the conversion-pattern determining unit 53 determines a conversion pattern using the information from the conversion-pattern detecting unit 71, the minimum-run-successive-occurrence-limitation-data detecting unit 91, and the minimum-run-successive-occurrence-limitation-data detecting and predicting unit 81. In Table 3, for example, when (11) and (110111)+"010" overlap, an output from the minimum-run-successive-occurrence limitation table 92A with a larger constraint length (the latter) is selected. In Table 3, for example, when (10) and (1001110111)+"except 101" overlap, an output from the minimum-run-successive-occurrence limitation table 92B with a larger constraint length (the latter) is selected according to an output from the minimum-run-successive-occurrence-limitation-data detecting and predicting unit 81. In Table 3, for example, when (10) and (1001110111)+"010" overlap, an output from the conversion table 72A with a smaller constraint length (the former) is selected according to an output from the minimum-run-successive-occurrence-limitation-data detecting and predicting unit 81.

A recording method (a modulating method) for the modulating apparatus 1 in FIG. 1 will be explained with reference to a flowchart in FIG. 9. In step S1, the adder 41 of the DSV-control-bit determining and inserting unit 21 adds a DSV control bit to a data row inputted. In step S2, the shift register 42 holds the data row added with the DSV control bit, which is supplied from the adder 41, in units of 2 bits. In step S3, the minimum-run-successive-occurrence-limitation-data detecting and predicting unit 81 executes prediction processing. In step S4, the minimum-run-successive-occurrence-limitation-data processing unit 82 executes minimum-run-successive-occurrence-limitation-data detection processing. In step S5, the conversion-data processing unit 51 executes conversion-pattern detection processing.

Actually, steps S3 to S5 are executed in parallel.

Figure 10:
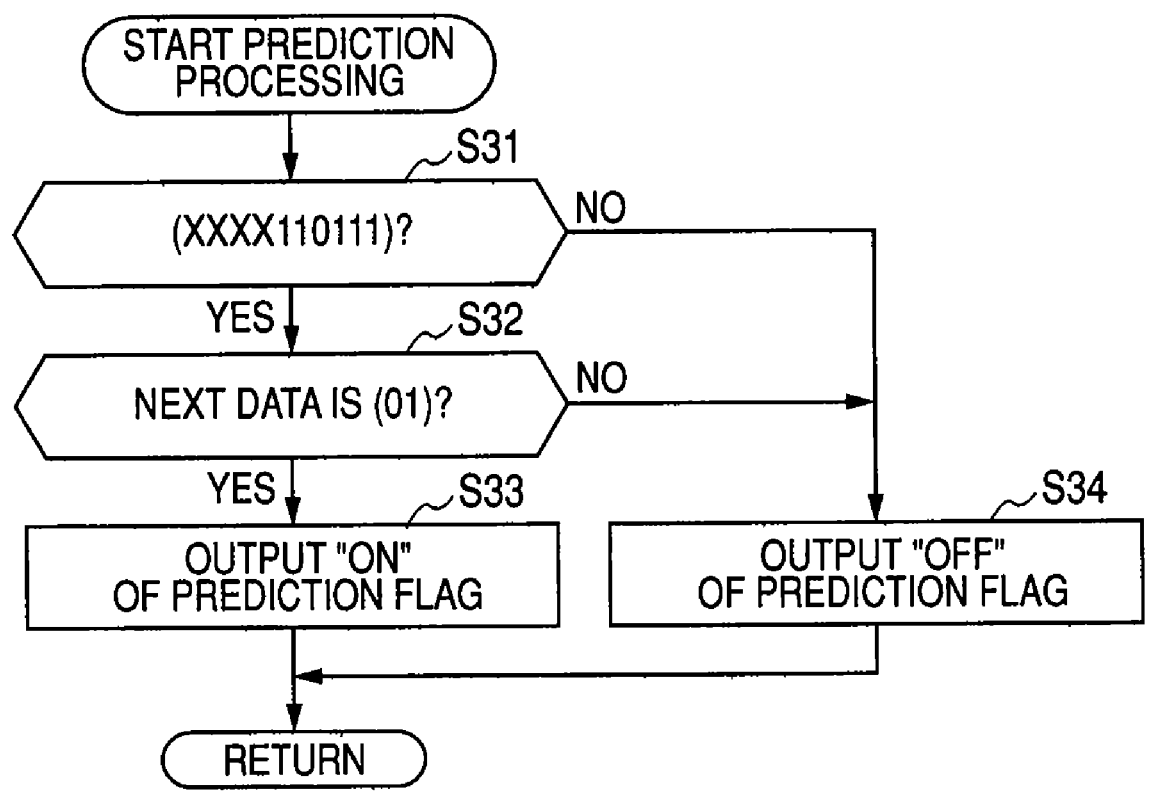
FIG. 10 is a flowchart for explaining prediction processing in step S3 in FIG. 9.

Details of the prediction processing in step S3 will be described later with reference to a flowchart in FIG. 10. According to the prediction processing, when the conversion pattern (110111) is included in data from the middle and the next data is (01), the prediction flag is turned on. Otherwise, the prediction flag is turned off.

Figure 11:
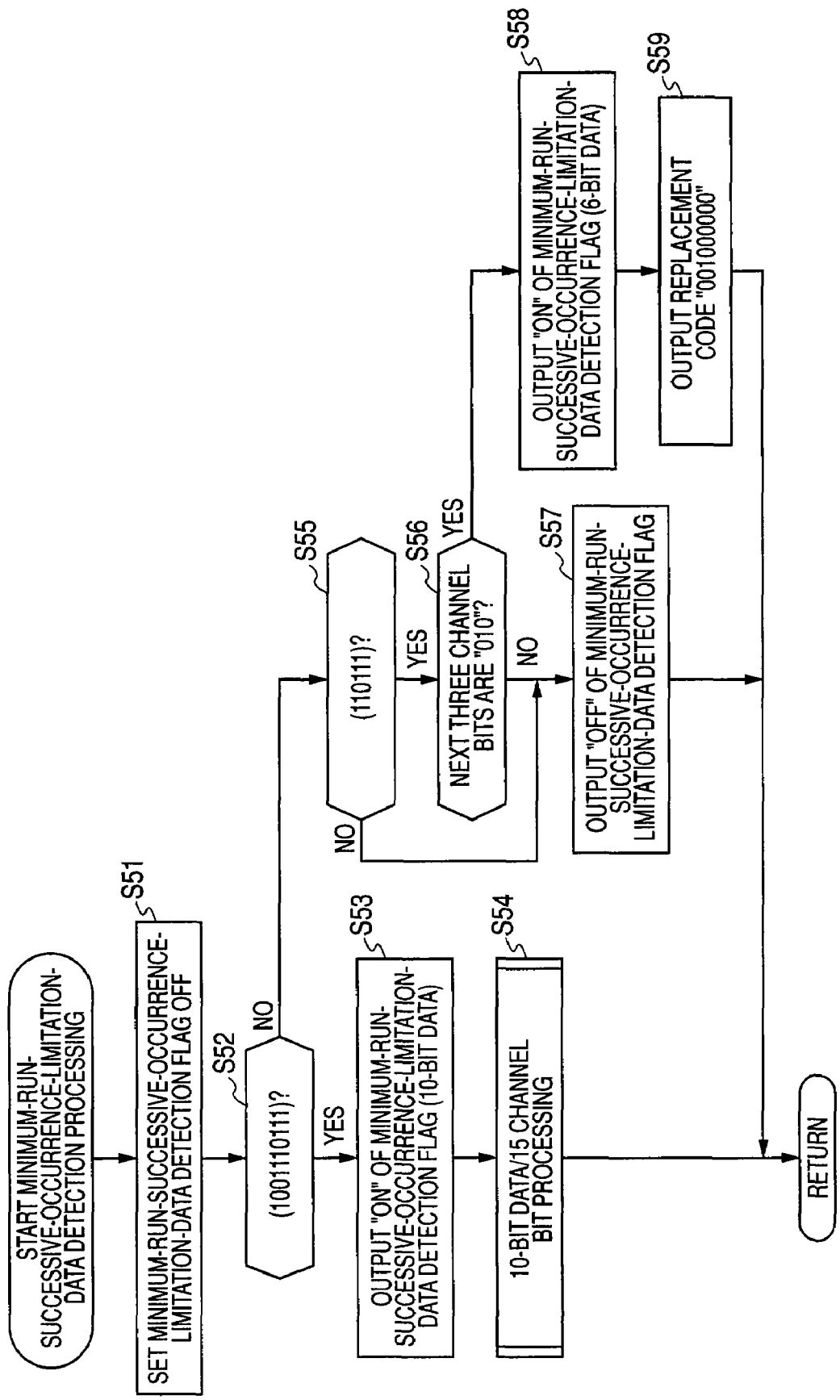
FIG. 11 is a flowchart for explaining minimum-run-successive-occurrence-limitation-data detection processing in step S4 in FIG. 9.

Details of the minimum-run-successive-occurrence-limitation-data detection processing in step S4 will be described later with reference to a flowchart in FIG. 11. According to the minimum-run-successive-occurrence-limitation-data detection processing, when data is the conversion pattern (1001110111), the minimum-run-successive-occurrence-limitation-data detection flag (10-bit data) is set to on and processing for converting 10-bit data into 15 channel bits is executed. When data is the conversion pattern (110111) and the next channel bit is "010", the minimum-run-successive-occurrence-limitation-data detection flag (6-bit data) is set to on. Otherwise, the minimum-run-successive-occurrence-limitation-data detection flag is set to off.

Figure 13:
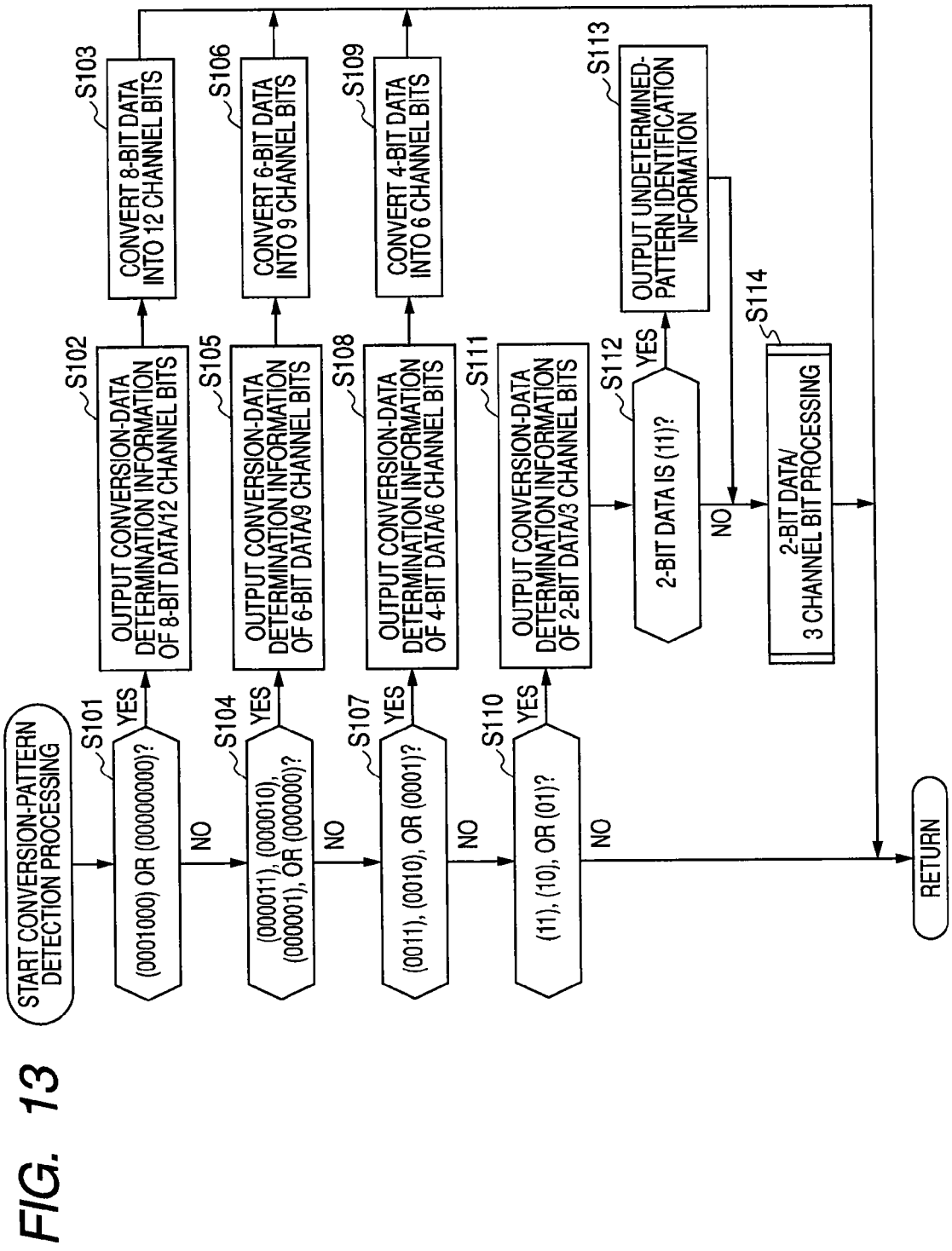
FIG. 13 is a flowchart for explaining conversion-pattern detection processing in step S5 in FIG. 9.

Details of the conversion-pattern detection processing in step S5 will be described later with reference to a flowchart in FIG. 13. According to the conversion-pattern detection processing, processing for converting 8-bit data into twelve channel bits, processing for converting 6-bit data into nine channel bits, processing for converting 4-bit data into six channel bits, or processing for converting 2-bit data into three channel bits is executed.

Referring back to FIG. 9, in step S6, the conversion-pattern determining unit 53 executes conversion-pattern determination processing. Details of this conversion-pattern determination processing will be explained later with reference to a flowchart in FIG. 17. According to the conversion-pattern determination processing, the conversion pattern converted by the conversion tables 72A to 72D of the conversion-data processing unit 51 or the conversion pattern converted by the minimum-run-successive-occurrence limitation tables 92A and 92B is selected and outputted.

In step S7, the synchronization-pattern inserting unit 23 inserts the synchronization pattern in the code string for which the conversion pattern inputted by the conversion-pattern determining unit 53 is finally decided. In step S8, the NRZI modulation unit 24 subjects the code string, in which the synchronization pattern is inserted, supplied from the synchronization-pattern inserting unit 23 to NRZI modulation. In step S9, the recording unit 12 records the code string subjected to NRZI modulation by the NRZI modulation unit 24 in the recording medium 13.

Details of the prediction processing in step S3 in FIG. 9 will be explained with reference to the flowchart in FIG. 10.

In step S31, the minimum-run-successive-occurrence-limitation-data detecting and predicting unit 81 judges whether data supplied from the shift register 42 coincides with a data pattern (xxxx11011). When the data supplied coincides with the data pattern (xxxx110111), in step S32, the minimum-run-successive-occurrence-limitation-data detecting and predicting unit 81 judges whether the next data is (01). When the next data is (01), in step S33, the minimum-run-successive-occurrence-limitation-data detecting and predicting unit 81 outputs "on" of the prediction flag to the conversion-pattern determining unit 53 as minimum-run-successive-occurrence-limitation-data detection and prediction information. When the prediction processing is started, the prediction flag is initially set to off in advance.

When it is judged in step S32 that the next data is not (01), in step S34, the minimum-run-successive-occurrence-limitation-data detecting and predicting unit 81 outputs "off" of the prediction flag. When it is judged in step S31 that the data does not coincide with the data pattern (xxxx110111), the minimum-run-successive-occurrence-limitation-data detecting and predicting unit 81 also outputs "off" of the prediction flag.

This prediction flag is used in step S232 in FIG. 17.

The minimum-run-successive-occurrence-limitation-data detection processing in step S4 in FIG. 9 will be explained with reference to the flowchart in FIG. 11.

In step S51, the minimum-run-successive-occurrence-limitation-data detecting unit 91 of the minimum-run-successive-occurrence-limitation-data processing unit 82 sets the minimum-run-successive-occurrence-limitation-data detection flag to off. In other words, the minimum-run-successive-occurrence-limitation-data detection flag (10-bit data) and the minimum-run-successive-occurrence-limitation-data detection flag (6-bit data) are initially set to off. In step S52, the minimum-run-successive-occurrence-limitation-data detecting unit 91 judges whether data supplied from the shift register 42 coincides with the data pattern (1001110111). When the data supplied coincides with the data pattern (1001110111), in step S53, the minimum-run-successive-occurrence-limitation-data detecting unit 91 outputs "on" of the minimum-run-successive-occurrence-limitation-data detection flag (10-bit data) to the conversion-pattern determining unit 53 and the minimum-run-successive-occurrence-limitation tables 92A and 92B as minimum-run-successive-occurrence-limitation-data detection information. This flag is used in step S231 in FIG. 17 described later.

In step S54, the minimum-run-successive-occurrence limitation table 92B executes 10-bit data/15 channel bit processing. Details of this processing are shown in FIG. 12.

In step S81, the minimum-run-successive-occurrence limitation table 92B outputs "$0$010 000 000 101" to the undetermined-bit determining unit 93. In step S82, the undetermined-bit determining unit 93 judges whether an immediately-preceding code flag is on. The immediately-preceding code flag is a flag outputted to the undetermined-bit determining unit 93 by the immediately-preceding-code detecting unit 54. Details of the immediately-preceding code flag will be explained later with reference to a flowchart in FIG. 15. This immediately-preceding code flag is set to on when one channel bit of an immediately-preceding code word string is "1".

When it is judged in step S82 that the immediately-preceding code flag is on (when an immediately-preceding code is "1"), in step S86, the undetermined-bit determining unit 93 sets the code word "$0$" including the undetermined code supplied from the minimum-run-successive-occurrence limitation table 92B as "000". In step S87, the undetermined-bit determining unit 93 outputs "000 010 000 000 101" to the conversion-pattern determining unit 53. This code string is selected and outputted in step S233 in FIG. 17.

When it is judged in step S82 that the immediately-preceding code flag is not on (is off) (when the immediately-preceding code is "0"), in step S83, the undetermined-bit determining unit 93 judges whether the immediately-preceding-code-word flag is on. This immediately-preceding-code-word flag is a flag detected by the immediately-preceding-code-word detecting unit 55 and supplied to the undetermined-bit determining unit 93. This flag is detected as shown in a flowchart in FIG. 16. Details of the immediately-preceding-code-word flag will be described later with reference to the flowchart in FIG. 16. The immediately-preceding-code-word flag is set to on when three channel bits of the immediately-preceding code word string are "010".

When it is judged in step S83 that the immediately-preceding-code-word flag is on (when the immediately-preceding code is "010"), in step S86, as in the case in which the immediately-preceding flag is on, the undetermined-bit determining unit 93 sets "000" in "$0$". In step S87, the undetermined-bit determining unit 93 outputs a channel bit string "000 010 000 000 101" to the conversion-pattern determining unit 53.

When it is judged in step S83 that the immediately-preceding-code-word flag is not on (is off) (when the immediately-preceding code is not "010"), in step S84, the undetermined-bit determining unit 93 sets "101" in the code word "$0$". In step S85, the undetermined-bit determining unit 93 outputs a channel bit string "101 010 000 000 101" to the conversion-pattern determining unit 53. This code string is selected and outputted in step S233 in FIG. 17.

Referring back to FIG. 11, when it is judged in step S52 that the data does not coincide with the data pattern (1001110111), in step S55, minimum-run-successive-occurrence-limitation-data detecting unit 91 judges whether the data coincides with the data pattern (110111). When the data coincides with the data pattern (110111), in step S56, the minimum-run-successive-occurrence-limitation-data detecting unit 91 judges whether the next three channel bits are "010". When the next three channel bits are "010", in step S58, the minimum-run-successive-occurrence-limitation-data detecting unit 91 outputs "on" of the minimum-run-successive-occurrence-data detection flag (6-bit data). This flag is used in step S234 in FIG. 17. In step S59, the minimum-run-successive-occurrence limitation table 92A outputs a replacement code string "001 000 000" to the conversion-pattern determining unit 53. This code string is selected and outputted in step S235 in FIG. 17.

When it is judged in step S56 that the next three channel bits are not "010", in step S57, the minimum-run-successive-occurrence-limitation-data detecting unit 91 outputs "off" of the minimum-run-successive-occurrence-limitation-data detection flag to the conversion-pattern determining unit 53. Even when it is judged in step S55 that the data does not coincide with the data pattern (110111), in step S57, "off" of the minimum-run-successive-occurrence-limitation-data detection flag is outputted. This "off" of the minimum-run-successive-occurrence-limitation-data detection flag means that the minimum-run-successive-occurrence-limitation-data detection flag (10-bit data) is off and means that the minimum-run-successive-occurrence-limitation-data detection flag (6-bit data) is off.

Details of the conversion-pattern detection processing in step S5 in FIG. 9 will be explained with reference to the flowchart in FIG. 13.

In step S101, the conversion-pattern detecting unit 71 judges whether data inputted from the shift register 42 coincides with the data patterns (00001000) and (00000000). When the data inputted coincides with the data pattern (00001000) or (00000000), in step S102, the conversion-pattern detecting unit 71 outputs conversion-data determination information of 8-bit data/12 channel bits. This information is supplied to the conversion-pattern determining unit 53 and the conversion tables 72A to 72D. This information is used in step S236 in FIG. 17. In step S103, the conversion table 72D converts 8-bit data into twelve channel bits. A code string of twelve channel bits is supplied to the conversion-pattern determining unit 53. When the data inputted coincides with the data pattern (00001000) or (00000000), a code string (000 100 100 100) or "010 100 100 100" is outputted, respectively. This code string is selected and outputted in step S237 in FIG. 17.

When it is judged in step S101 that the data inputted does not coincide with the data patterns (00001000) and (00000000), in step S104, the conversion-pattern detecting unit 71 judges whether the data inputted coincides with the data patterns (000011), (000010), (000001), and (000000). When the data inputted coincides with any one of the four data patterns, in step S105, the conversion-pattern detecting unit 71 outputs determination information of 6-bit data/9 channel bits to the conversion-pattern determining unit 53 and the conversion tables 72A to 72D. This information is used in step S238 in FIG. 17. In step S106, the conversion table 72C converts 6-bit data into 9 channel bits and outputs the 9 channel bits to the conversion-pattern determining unit 53. When the data inputted is any one of the data patterns (000011), (000010), (000001), and (000000), a code string "000 100 100", "000 100 000", "010 100 100", or "010 100 000" is outputted, respectively. This code string is selected and outputted in step S239 in FIG. 17.

When it is judged in step S104 that the data inputted does not coincide with all of the data patterns (000011), (000010), (000001), and (000000), in step S107, the conversion-pattern detecting unit 71 judges whether the data inputted coincides with data patterns (0011), (0010), and (0001). When the data inputted coincides with any one of the three data patterns, in step S108, the conversion-pattern detecting unit 71 outputs conversion-data determination information of 4-bit data/6 channel bits to the conversion-pattern determining unit 53 and the conversion tables 72A to 72D. This information is used in step S240 in FIG. 17. In step S109, the conversion table 72B converts 4-bit data into 6 channel bits and outputs the 6 channel bits to the conversion-pattern determining unit 53. When the data inputted coincides with the data pattern (0011), a code string "010 100" is outputted. When the data inputted coincides with the data pattern (0010), a code string "010 000" is outputted. When the data inputted coincides with the data pattern (0001), a code string "000 100" is outputted. This code string is selected and outputted in step S241 in FIG. 17.

When it is judged in step S107 that the data inputted does not coincide with all of the data patterns (0011), (0010), and (0001), in step S110, the conversion-pattern detecting unit 71 judges whether the data inputted coincides with data patterns (11), (10), and (01). When the data inputted coincides with any one of the three data patterns, in step S111, the conversion-pattern detecting unit 71 outputs conversion-data determination information of 2-bit data/3 channel bits to the conversion-pattern determining unit 53 and the conversion tables 72A to 72D. This information is used in steps S242 and S243 in FIG. 17.

In step S112, the conversion-pattern detecting unit 71 judges whether 2-bit data inputted coincides with the data pattern (11). When the data inputted coincides with the data pattern (11), in step S113, the conversion-pattern detecting unit 71 outputs undetermined-pattern identification information to the selector 73. The undetermined-pattern identification information is used in step S142 in FIG. 14 described later.

When it is judged in step S112 that the data inputted does not coincide with the data pattern (11), the processing in step S113 is skipped. After the processing in step S113 or when it is judged in step S112 that the data does not coincide with the data pattern (11), in step S114, the conversion table 72A executes 2-bit data/3 channel bit processing. Details of this 2-bit data/3 channel bit processing are shown in a flowchart in FIG. 14.

Figure 14:
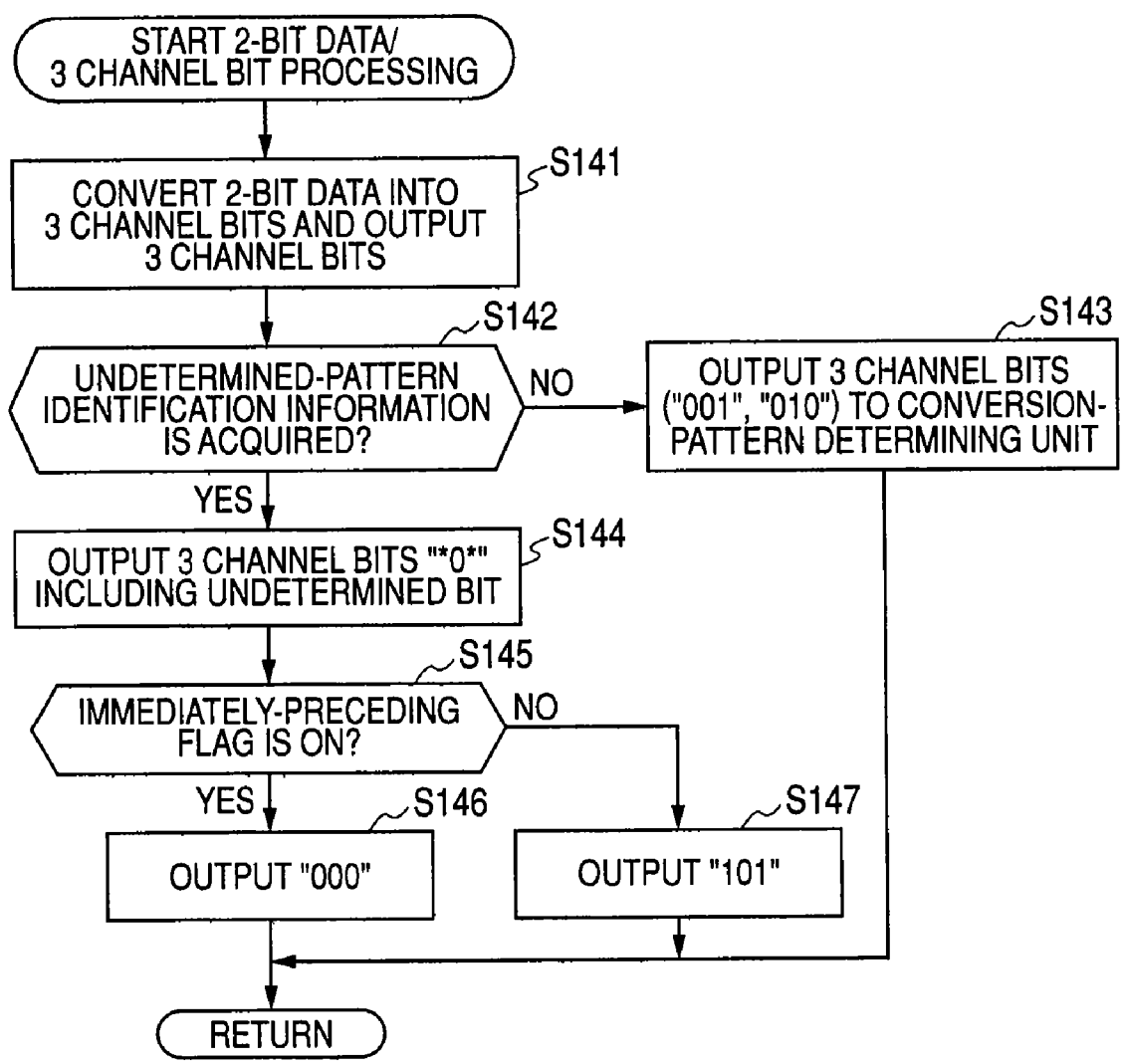
FIG. 14 is a flowchart for explaining 2-bit data/3 channel bit processing in step S114 in FIG. 13.

Details of the 2-bit data/3 channel bit processing in step S114 in FIG. 13 will be explained with reference to the flowchart in FIG. 14.

In step S141, the conversion table 72A converts the 2-bit data into three channel bits and outputs the three channel bits to the selector 73. In other words, the conversion table 72A outputs a code word "*0*" when the data inputted coincides with the data pattern (11), outputs a code word "001" when the data inputted coincides with the data pattern (10), and outputs a code word "010" when the data inputted coincides with the data pattern (01).

In step S142, the undetermined-bit determining unit 74 judges whether the undetermined-pattern identification information is acquired. When the undetermined-pattern identification information (outputted in step S113 in FIG. 13) is not acquired from the conversion-pattern detecting unit 71, in step S143, the selector 73 executes processing for outputting the three channel bits to the conversion-pattern determining unit 53. Specifically, channel bits "001" and "010" inputted from the conversion table 72A is outputted to the conversion-pattern determining unit 53. The channel bits are selected and outputted in step S245 in FIG. 17.

On the other hand, when it is judged in step S142 that the undetermined-pattern identification information is acquired from the conversion-pattern detecting unit 71, in step S144, the selector 73 outputs three channel bits "*0*" including an undetermined bit. In other words, the three channel bits "*0*" are supplied to the undetermined-bit determining unit 74. In step S145, the undetermined-bit determining unit 74 judges whether an immediately-preceding code flag is on. This immediately-preceding code flag is supplied from the immediately-preceding-code detecting unit 54 on the basis of processing in FIG. 15 described later. When the immediately-preceding code flag is on (when one channel bit of an immediately-preceding code word string is "1"), in step S146, the undetermined-bit determining unit 74 outputs the code word "000" to the conversion-pattern determining unit 53. On the other hand, when the immediately-preceding code flag is not on (is off) (when the one channel bit of the immediately-preceding code word string is "0"), in step S147, the undetermined-bit determining unit 74 outputs the code word "101" to the conversion-pattern determining unit 53. The code string outputted in steps S146 and S147 is selected and outputted in step S244 in FIG. 17.

Processing of the immediately-preceding-code detecting unit 54 and the immediately-preceding-code-word detecting unit 55 will be explained with reference to the flowcharts in FIGS. 15 and 16.

First, immediately-preceding-code detection processing of the immediately-preceding-code detecting unit 54 will be explained with reference to the flowchart in FIG. 15.

In step S171, the immediately-preceding-code detecting unit 54 judges, from the code string finally decided by the conversion-pattern determining unit 53, whether one channel bit of an immediately-preceding code string of the next conversion processing is "1". When the one channel bit of the immediately-preceding code string is "1", in step S172, the immediately-preceding-code detecting unit 54 outputs "on" of an immediately-preceding code flag. On the other hand, when it is judged in step S171 that the one channel bit of the immediately-preceding code string is not "1" (when it is judged that the one channel bit is "0"), in step S173, the immediately-preceding-code detecting unit 54 outputs "off" of the immediately-preceding code flag. This immediately-preceding code flag is outputted to the undetermined-bit determining unit 74 and the undetermined-bit determining unit 93 and used in step S82 in FIG. 12 and step S145 in FIG. 14.

Immediately-preceding-code-word detection processing by the immediately-preceding-code-word detecting unit 55 will be explained with reference to the flowchart in FIG. 16.

In step S201, the immediately-preceding-code-word detecting unit 55 judges, from the code string determined by the conversion-pattern determining unit 53, whether three channel bits of an immediately-preceding code word string of the next conversion processing is "010". When the three channel bits of the immediately-preceding code word string is "010", in step S202, the immediately-preceding-code-word detecting unit 55 outputs "on" of the immediately-preceding-code-word flag. When it is judged in step S201 that the three channel bits of the immediately-preceding code word string are not "010" (when the three channel bits are "000", "101", or "001"), in step S203, the immediately-preceding-code-word detecting unit 55 outputs "off" of the immediately-preceding-code-word flag. This immediately-preceding-code-word flag is outputted to the undetermined-bit detecting and determining unit 93 and used in step S83 in FIG. 12.

Details of the conversion-pattern determination processing in step S6 in FIG. 9 will be explained with reference to the flowchart in FIG. 17.

In step S231, the conversion-pattern determining unit 53 judges whether a minimum-run-successive-occurrence-limitation-data detection flag (10-bit data) is on. This minimum-run-successive-occurrence-limitation-data detection flag (10-bit data) is the minimum-run-successive-occurrence-limitation-data detection flag outputted by the minimum-run-successive-occurrence-limitation-data detecting unit 91 in step S53 or S57 in FIG. 11. When the minimum-run-successive-occurrence-limitation-data detection flag (10-bit data) is on (when input data coincides with the data pattern (1001110111)), in step S232, the conversion-pattern determining unit 53 judges whether a prediction flag is on. This prediction flag is the prediction flag outputted by the minimum-run-successive-occurrence-limitation-data detecting and predicting unit 81 in step S33 or S34 in FIG. 10.

When the prediction flag is not on (is off) (when an input data row does not coincide with the data pattern (xxxx110111) or, even if the input data row coincides with the data pattern (xxxx110111), the next data is not (01)), in step S233, the conversion-pattern determining unit 53 selects and outputs 10-bit data/15 channel bits (a replacement pattern). In other words, when the prediction flag is off (when the data is not (xxxx110111) or, even if the data is (xxxx110111), the next data is not (01)), the code string outputted in step S85 or S87 in FIG. 12 is selected and outputted to the synchronization-pattern inserting unit 23.

On the other hand, when the prediction flag is on (when the data is (xxxx110111) and the next data is (01)), the processing in step S233 is not executed and conversion processing for 8-bit data/12 channel bits in step S236 described later and subsequent processing are executed. Consequently, when minimum-run-successive-occurrence-limitation data (1001110111), which can include minimum-run-successive-occurrence-limitation data (110111)+"010" in a part thereof, is input data, if (xxxx110111)+(01) (after all, (xxxx11011101)) is satisfied, the input data (1001110111) is not collectively subjected to conversion processing and processing for dividing the input data (1001110111) from the top to convert 2 bits is executed.

When the prediction flag is on, in step S236, the conversion-pattern determining unit 53 judges whether conversion-data determination information of 8-bit data/12 channel bits is received. This determination information is the determination information outputted in step S102 in FIG. 13. When the conversion-data determination information of 8-bit data/12 channel bits is received, in step S237, the conversion-pattern determining unit 53 selects and outputs a conversion output of 8-bit data/12 channel bits. In other words, the channel bits converted in step S103 in FIG. 13 are selected and outputted.

When it is judged in step S236 that the conversion-data determination information of 8-bit data/12 channel bits is not received, in step S238, the conversion-pattern determining unit 53 judges whether conversion-data determination information of 6-bit data/9 channel bits is received. This determination information is the determination information outputted in step S105 in FIG. 13. When the conversion-data determination information of 6-bit data/9 channel bits is received, in step S239, the conversion-pattern determining unit 53 selects and outputs a conversion output of 6-bit data/9 channel bits. In other words, the data outputted in step S106 in FIG. 13 is selected and outputted.

When it is judged in step S238 that the conversion-data determination information of 6-bit data/9 channel bits is not received, in step S240, the conversion-pattern determining unit 53 judges whether conversion-data determination information of 4-bit data/6 channel bits is received. This determination information is the determination information outputted in step S108 in FIG. 13. When the conversion-data determination information of 4-bit data/6 channel bits is received, in step S241, the conversion-pattern determining unit 53 selects and outputs a conversion output of 4-bit data/6 channel bits. In other words, the channel bits outputted in step S109 in FIG. 13 are selected and outputted.

When it is judged in step S240 that the conversion-data determination information of 4-bit data/6 channel bits is not received, in step S242, the conversion-pattern determining unit 53 judges whether conversion-data determination information of 2-bit data/3 channel bits is received from the conversion-pattern detecting unit 71. This information is the information outputted in step S111 in FIG. 13. When the conversion-data determination information of 2-bit data/3 channel bits is received, in step S243, the conversion-pattern determining unit 53 further judges whether the conversion-data determination information of 2-bit data/3 channel bits is conversion-data determination information of the data (11).

In other words, it is judged whether the conversion-data determination information is a data pattern that could have been converted into a code including an undetermined code. When it is judged that the conversion-data determination information of the data (11) is received, in step S244, the conversion-pattern determining unit 53 executes processing for selecting and outputting three channel bits outputted by the undetermined-bit determining unit 74. In other words, the code string outputted in the processing in step S146 or S147 in FIG. 14 is selected and outputted.

On the other hand, when it is judged in step S243 that the conversion-data determination information of 2-bit data/3 channel bits is not the conversion-data determination information of the data (11) (when it is judged that the conversion-data determination information is not a channel bit of data to be converted into a code including an undetermined code), in step S245, the conversion-pattern determining unit 53 selects and outputs three channel bits of the selector 73. In other words, in this case, the code string outputted in step S143 in FIG. 14 is selected and outputted.

When it is judged in step S231 that the minimum-run-successive-occurrence-limitation-data detection flag (10-bit data) is not on (is off) (when it is judged that the data pattern of the input data is not (1001110111)), in step S234, the conversion-pattern determining unit 53 judges whether a minimum-run-successive-occurrence-limitation-data detection flag (6-bit data) is on. This minimum-run-successive-occurrence-limitation-data detection flag (6-bit data) is the minimum-run-successive-occurrence-data detection flag outputted in step S58 in FIG. 11 when the data pattern is (110111) and the next three channel bits are "010". When it is judged in step S234 that the minimum-run-successive-occurrence-limitation-data detection flag (6-bit data) is on, in step S235, the conversion-pattern determining unit 53 selects and outputs a conversion output of 6-bit data/9 channel bits (a replacement pattern). In other words, the replacement code "001 000 000" outputted in step S59 in FIG. 11 is selected and outputted. This is different from step S239 in that the channel bits outputted in step S106 in FIG. 13 are outputted in step S239.

When it is judged in step S234 that the minimum-run-successive-occurrence-limitation-data detection flag (6-bit data) is off (when the input data does not coincide with the data pattern (110111) or, even if the input data coincides with the data pattern (110111), the next channel bit is not "010"), processing in step S236 and subsequent steps are executed as in the case in which it is judged in step S232 that the prediction flag is on.

Figure 9:
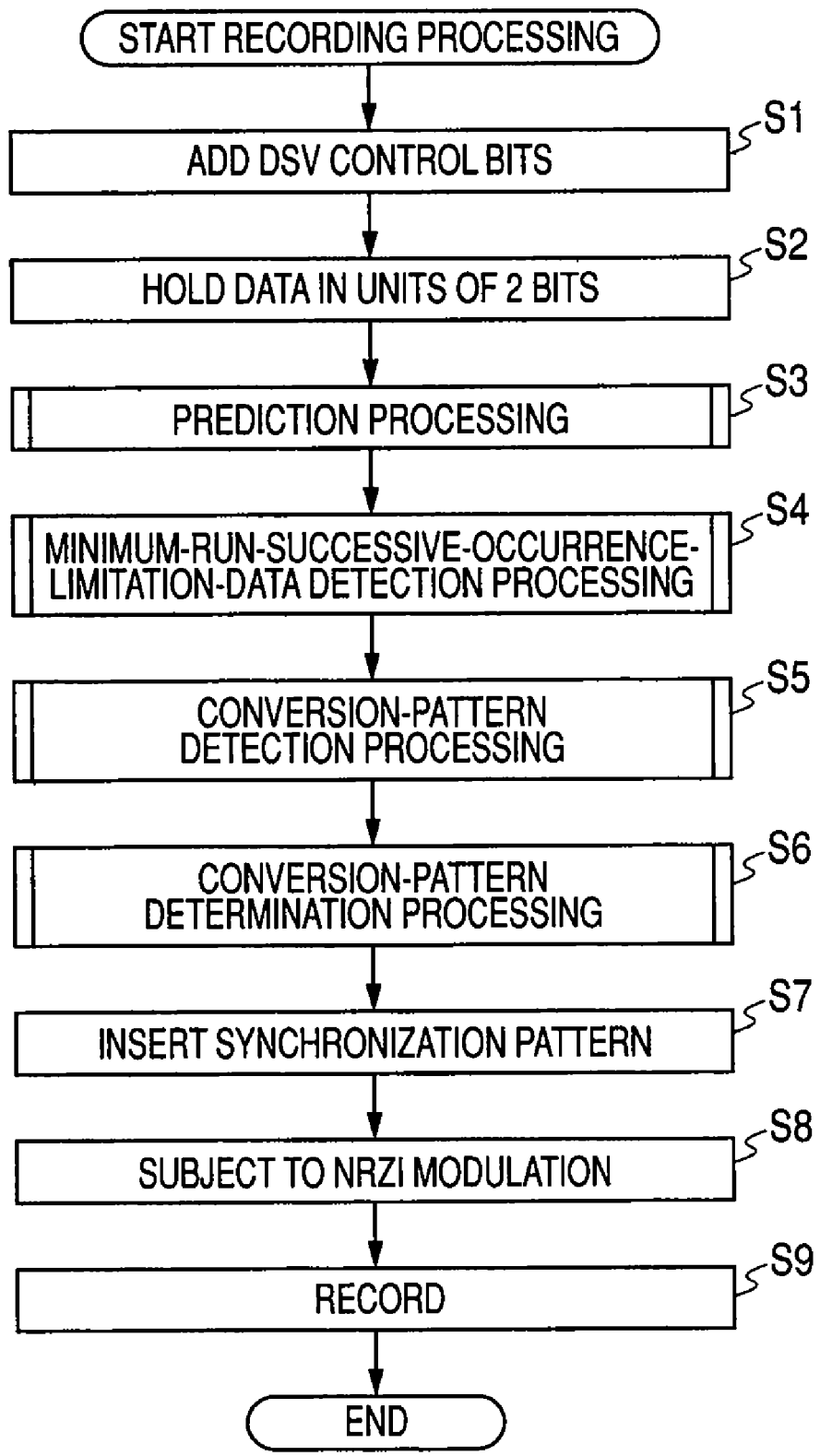
FIG. 9 is a flowchart for explaining recording processing.

After the processing in steps S233 or S235, the processing returns to step S7 in FIG. 9. Consequently, even when the data (10) and (01) are subjected to conversion processing in parallel, the processing in step S233 or S235 is preferentially executed.

After the processing in steps S237, S239, S241, S244, and S245 is performed or when it is judged in step S242 that the conversion-data determination information of 2-bit data/3 channel bits is not received, the processing returns to step S7 in FIG. 9.

When a conversion pattern is determined as described above, the data row is shifted in the shift register 42 by bits equivalent to the channel bits determined and conversion-pattern determination processing for the next data is executed.

Figure 18:
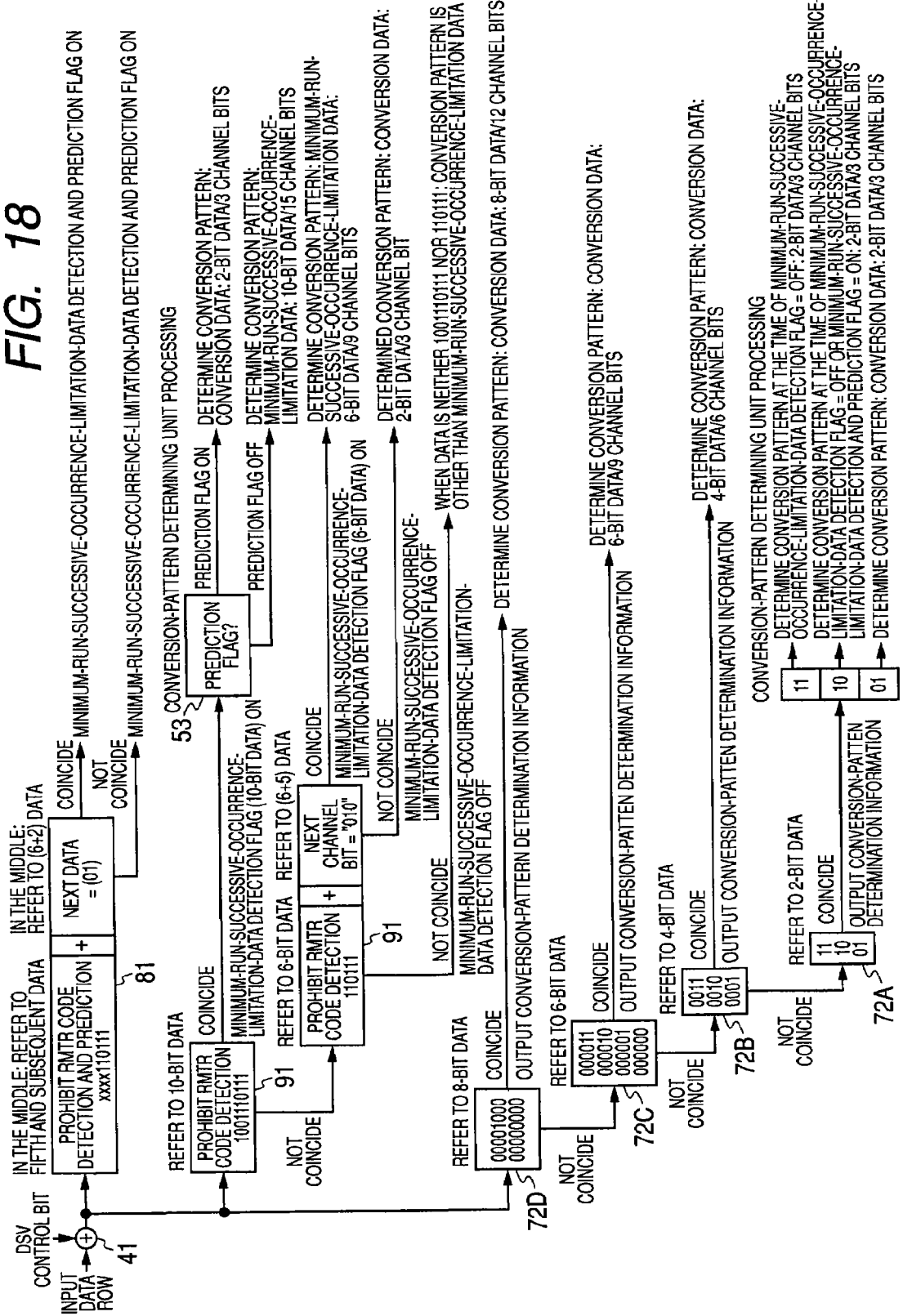
FIG. 18 is a diagram for explaining main processing of a modulating unit.

In the processing described above, processing of the minimum-run-successive-occurrence-limitation-data detecting and predicting unit 81, the minimum-run-successive-occurrence-limitation-data detecting unit 91, the minimum-run-successive-occurrence-limitation tables 92A and 92B, the conversion-pattern detecting unit 71, and the conversion tables 72A to 72D will be further explained with reference to FIG. 18.

When an input data row is (xxxx110111), it is judged whether the next 2-bit data is (01). When the next 2-bit data is (01), the minimum-run-successive-occurrence-limitation-data detecting and predicting unit 81 outputs "on" of a prediction flag. When the next 2-bit data is not (01), the minimum-run-successive-occurrence-limitation-data detecting and predicting unit 81 outputs "off" of the prediction flag.

The detection of minimum-run-successive-occurrence-limitation data is performed by comparing whether 10-bit data of the input data row coincides with the minimum-run-successive-occurrence-limitation data (1001110111) of 10-bit data with the constraint length i=5 using the minimum-run-successive-occurrence-limitation-data detecting unit 91. When the 10-bit data of the input data row coincides with the minimum-run-successive-occurrence-limitation data (1001110111), the conversion-pattern determining unit 53 further judges on the basis of the prediction flag whether the following data is (01). When the following data is not (01) (the prediction flag outputted from the minimum-run-successive-occurrence-limitation-data detecting and predicting unit 81 is off), the data (1001110111) is collectively converted. However, when the following data is (01) (the prediction flag is on), the data (1001110111) is not collectively converted and the data is divided and 2 bits from the top are processed (subjected to exception processing). When the 10-bit data does not coincide with the data pattern (1001110111), the minimum-run-successive-occurrence-limitation-data detecting unit 91 judges whether 6-bit data coincides with the minimum-run-successive-occurrence-limitation data (110111) of 6-bit data with the constraint length i=3 in Table 3. When the 6-bit data coincides with the minimum-run-successive-occurrence-limitation data (110111), the minimum-run-successive-occurrence-limitation-data detecting unit 91 refers to the following 5-bit data in order to further judge whether the following channel bit string is "010" in the data row. When the channel bit string coincides with any one of patterns of (01), (001), and (00000) from the top of the 5-bit data and termination (0000), minimum-run-successive-occurrence-limitation-code detection processing for the 6-bit data is performed.

In the detection of a conversion pattern, the conversion-pattern detecting unit 71 refers to 8-bit data from the input data row and compares the 8-bit data with the conversion patterns of 8-bit data with the constraint length 4 in Table 3 to find whether the 8-bit data coincides with the conversion patterns. When there is a pattern that coincides with the 8-bit data, the conversion table 72D determines a replacement code. When the 8-bit data does not coincide with the conversion patterns, the conversion-pattern detecting unit 71 refers up to 6-bit data and compares the 6-bit data with the conversion patterns of the 6-bit data with the constraint length 3 in Table 3 to find whether the 6-bit data coincides with the conversion patterns. When there is a pattern that coincides with the 6-bit data, the conversion table 72C determines a conversion code. When the 6-bit data does not coincide with the conversion patterns, the conversion-pattern detecting unit 71 refers up to 4-bit data and compares the 4-bit data with the conversion patterns of the 4-bit data with the constraint length 2 in Table 3 to find whether the 4-bit data coincides with the conversion patterns. When there is a pattern that coincides with the 4-bit data, the conversion table 72B determines a conversion code. When the 4-bit data does not coincide with the conversion patterns, finally, the conversion-pattern detecting unit 71 refers up to 2-bit data and compares the 2-bit data with the tables (11), (10), and (01) of the 2-bit data with the constraint length 1 in Table 3. When there is a pattern that coincides with the 2-bit data, the conversion table 72A determines a conversion code.

The data in the input data row is shifted forward in the shift register 42 by bits determined. The next detection processing is repeated in the same manner.

Figure 19:
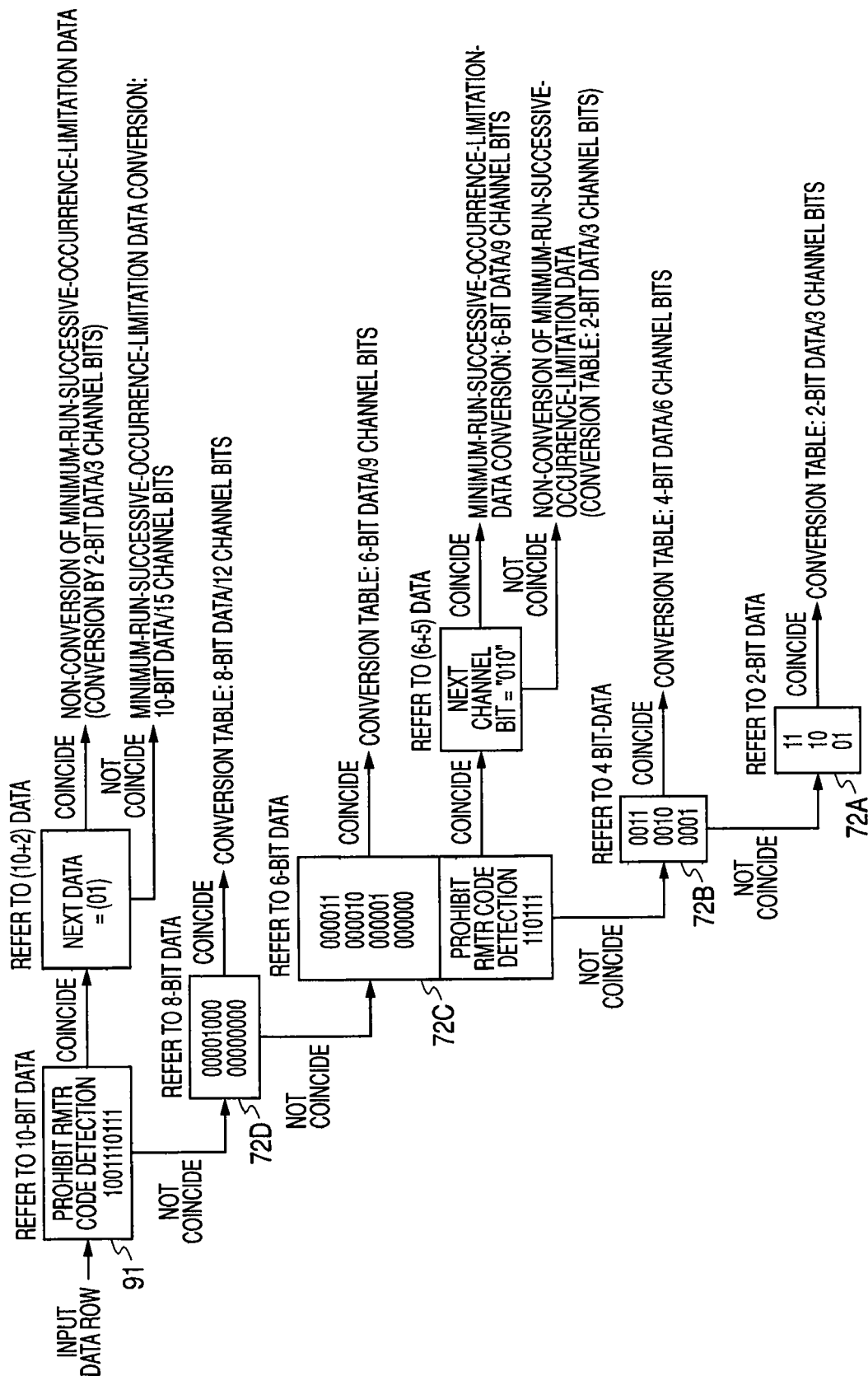
FIG. 19 is another diagram for explaining the main processing of the modulating unit.

States of the data detection are classified according to constraint lengths and explained as shown in FIG. 19. The minimum-run-successive-occurrence-limitation-data detecting unit 91 refers to 10-bit data from the input data row and compares the 10-bit data with the minimum-run-successive-occurrence-limitation data (1001110111) of the 10-bit data with the constraint length 5 in Table 3 to find whether the 10-bit data coincides with the minimum-run-successive-occurrence-limitation data (10001110111). When the 10-bit data coincides with the minimum-run-successive-occurrence-limitation data (10001110111), the minimum-run-successive-occurrence-limitation-data conversion processing for the 10-bit data is performed excluding exception processing described below. The minimum-run-successive-occurrence-limitation-data detecting and predicting unit 81 refers to the following 2-bit data and, when the 2-bit data is (01), does not perform processing for collectively converting the minimum-run-successive-occurrence-limitation data (1001110111) as the exception processing but divides the minimum-run-successive-occurrence-limitation data (1001110111) and processes 2 bits from the top of the data.

When the 10-bit data does not coincide with the minimum-run-successive-occurrence-limitation data (10001110111), the minimum-run-successive-occurrence-limitation-data detecting unit 91 refers up to 8-bit data and compares the 8-bit data with the conversion patterns of the 8-bit data with the constraint length 4 in Table 3 to find whether the 8-bit data coincides with the conversion patterns. When there is a pattern that coincides with the conversion patterns, the conversion table 72D determines a replacement code.

When the 8-bit data does not coincide with the conversion patterns, the minimum-run-successive-occurrence-limitation-data detecting unit 91 refers up to 6-bit data and compares the 6-bit data with the minimum-run-successive-occurrence-limitation data (110111) of the 6-bit data with the constraint length 3 in Table 3 to find whether the 6-bit data coincides with the minimum-run-successive-occurrence-limitation data (110111). When the 6-bit data coincides with the minimum-run-successive-occurrence-limitation data (110111), the minimum-run-successive-occurrence-limitation-data detecting unit 91 further refers to the following 5-bit data in order to find, in the data row, a condition under which the following channel bit string is "010". When the top of the 5-bit data coincides with any one of patterns of (01), (001), and (00000) and termination (0000), minimum-run-successive-occurrence-limitation-data conversion processing for the 6-bit data is performed. When the top of the 5-bit data does not coincide with all of the patterns, the minimum-run-successive-occurrence-limitation-data conversion processing is not performed and the 6-bit data is divided in units of 2 bits and subjected to conversion processing.

When the data pattern (110111) is not detected, the minimum-run-successive-occurrence-limitation-data detecting unit 91 further compares the 6-bit data with the conversion patterns of the 6-bit data with the constraint length 3 in Table 3 to find whether the 6-bit data coincides with the conversion patterns of the 6-bit data with the constraint length 3 in Table 3. When there is a pattern that coincides with the 6-bit data, the conversion table 72C determines a conversion code. When the 6-bit data does not coincide with the conversion patterns, the minimum-run-successive-occurrence-limitation-data detecting unit 91 refers up to 4-bit data and compares the 4-bit data with the conversion patterns of the 4-bit data with the constraint length 2 in Table 3 to find whether the 4-bit data coincides with the conversion patterns. When there is a pattern that coincides with the 4-bit data, the conversion table 72B determines a conversion code. When the 4-bit data does not coincide with the conversion patterns, finally, the minimum-run-successive-occurrence-limitation-data detecting unit 91 refers up to 2-bit data and compares the 2-bit data with the patterns (11), (10), and (01) of the 2-bit data with the constraint length 1 in Table 3 to find whether the 2-bit data coincides with the patterns (11), (10), and (01). When there is a pattern that coincides with the 2-bit data among the patterns, the conversion table 72A determines a conversion code.

As in the case described above, the data in the input data row is shifted forward in the shift register 42 by bits determined. The next detection processing is repeated in the same manner.

As described above, a modulation table and a modulating apparatus for improving an error propagation characteristic are realized by adopting the same basic structure as the 1,7 PP code, that is, the minimum run d=1, the maximum run k=7, and the conversion rate (m:n)=(2:3), inserting one DSV control bit in a predetermined position in the data row to perform the DSV control efficiently, and limiting the number of times of successive occurrence of the minimum run to five times.

In the respective constraint lengths of the data pattern and the code pattern in Table 3, an order of array may be changed within an identical rule. For example, the constraint length i=1 portion of Table 3 shown below as Table 5 can be arrayed as shown in Table 6 below.

TABLE 5

|  | Data Pattern | Code Pattern |
|---|---|---|
| i = 1 | 11 | *0* |
|  | 10 | 001 |
|  | 01 | 010 |

TABLE 6

|  | Data Pattern | Code Pattern |
|---|---|---|
| i = 1 | 11 | *0* |
|  | 10 | 010 |
|  | 01 | 001 |

Even in this case, when the number of "1s" in elements of the data pattern and the number of "1s" in elements of the code pattern are divided by 2, the remainders are the same, either "1" or "0".

Besides, (1) and (0) of the respective elements of the data pattern in Table 3 may be inverted. A part of Table 3 shown as Table 7 below can be arrayed as shown in Table 8. Even in this case, when the number of "1s" in elements of the data pattern and the number of "1s" in elements of the code pattern are divided by 2, the remainders are the same, either "1" or "0".

TABLE 7

| Data Pattern | Code Pattern |
| --- | --- |
| 11 | *0* |
| 10 | 001 |
| 01 | 010 |
| 0011 | 010 100 |
| 0010 | 010 000 |
| 0001 | 000 100 |

TABLE 8

| Data Pattern | Code Pattern |
| --- | --- |
| 00 | *0* |
| 01 | 001 |
| 10 | 010 |
| 1100 | 010 100 |
| 1101 | 010 000 |
| 1110 | 000 100 |

Table 3 can also be changed as described below on the basis of a request of a system. For example, when it is possible to allow the maximum run k=8, in Table 3, it is possible to omit a conversion pattern with the constraint length i=4 serving as a replacement pattern for realizing the maximum run k=7. In other words, in Table 3 in which the conversion pattern with the constraint length i=4 is omitted, according to i=1 to i=3 of the basic pattern, it is possible to realize an RLL code with the minimum run d=1 and the maximum run k=8. According to a replacement pattern for limiting successive occurrence of the minimum run of i=3, i=5, and i=6, it is possible to generate a code word string with successive occurrence of the minimum run limited to five times at the maximum.

When allowable with respect to performance of the DSV control, for example, in Table 3, it is also possible to form a table in which a rule of parity in a portion is different from that in other portions by forming only a portion with the constraint length i=4 to have parity opposite to that of the other portions. Besides, in all the patterns of the respective tables, it is possible to select the number if "1s" in the data pattern and the number of "1s" in the code pattern such that, when the number of "1s" in the data pattern and the number of "1s" in the code pattern are divided by 2, the remainders are not the same. However, in that case, it is necessary to perform the selection uniformly in all the patterns.

It is possible to realize all the tables in the same manner using the modulating apparatus according to the embodiment.

Figure 20:
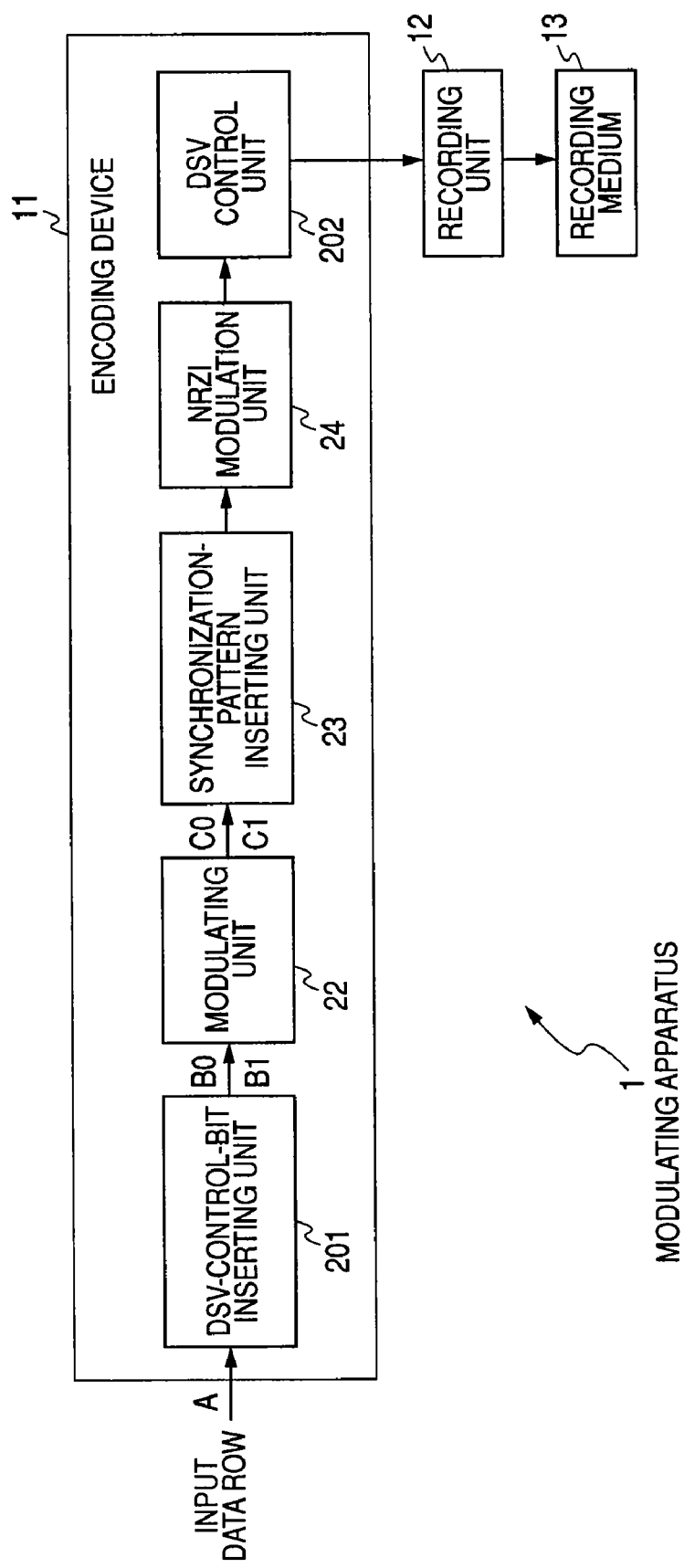
FIG. 20 is a block diagram showing a structure of a modulating apparatus according to another embodiment.

In the modulating apparatus 1 in FIG. 1, optimum one of 1 and 0 is determined as a DSV control bit by the DSV-control-bit determining and inserting unit 21 and added. However, it is also possible to prepare a data row added with 0 and a data row added with 1, process both the data rows, and select one of the data row at a last stage. FIG. 20 shows an example of a structure of a modulating apparatus in this case.

In the encoding device 11 of the modulating apparatus 1 in FIG. 20, a DSV-control-bit inserting unit 201 is arranged instead of the DSV-control-bit determining and inserting unit 21. A DSV control unit 202 is inserted at the post stage of the NRZI modulation unit 24 (at the pre-stage of the recording unit 12). The other components are the same as those shown in FIG. 1 and FIG. 20.

Figure 21:
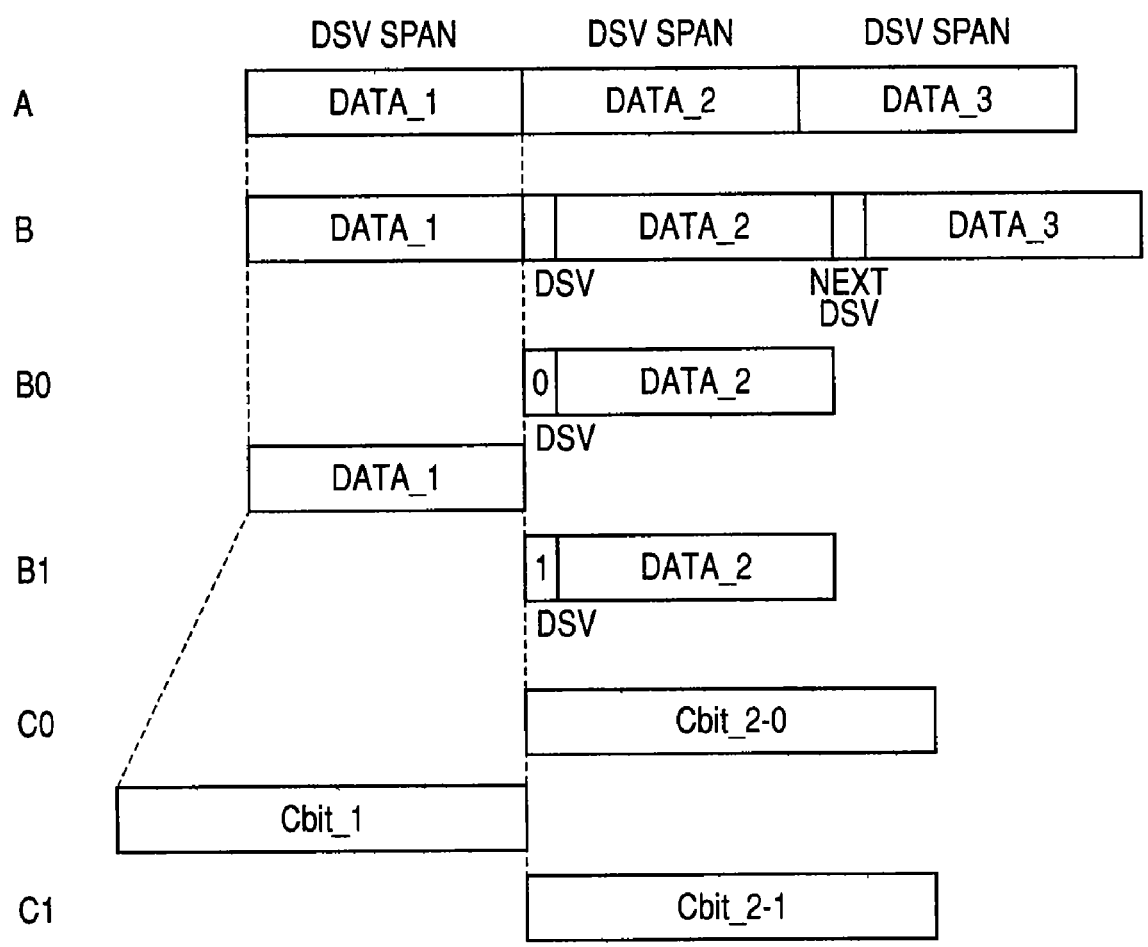
FIG. 21 is a diagram for explaining a data format of the modulating apparatus in FIG. 20.

In the modulating apparatus 1 in FIG. 20, the DSV-control-bit inserting unit 201 generates both a data row in which 0 is inserted as the DSV control bit (B0 in FIG. 21) and a data row in which 1 is inserted as the DSV control bit (B1 in FIG. 21) from an input data row (A in FIG. 21). The respective data rows are supplied to the modulating unit 22 and converted into a channel bit string (C0 and C1 in FIG. 21). The synchronization-pattern inserting unit 23 inserts synchronization patterns in the channel bit strings of two series inputted by the modulating unit 22, respectively, and outputs channel bit strings of two series. The NRZI modulation unit 24 subjects the channel bit strings of the two series to NRZI modulation, respectively, and outputs the channel bit strings to the DSV control unit 202. The DSV control unit 202 selects optimum one of the channel bit strings of the two series for each span and supplies one channel bit string to the recording unit 12. The recording unit 12 records the channel bit string finally selected by the DSV control unit 202 in the recording medium 13.

As described above, it is possible to realize a modulation table and a modulating apparatus for improving an error propagation characteristic by adopting the same basic structure as the 1,7 PP code, that is, the minimum run d=1, the maximum run k=7, and the conversion rate (m:n)=(2:3), inserting one DSV control bit in a predetermined position in the data row to perform the DSV control efficiently, and limiting the number of times of successive occurrence of the minimum run to five times.

A result obtained by verifying a result of modulation using the modulation table according to this embodiment is described below. In a data row that is modulated in accordance with Table 3 and in which successive occurrence of Tmin is limited and the DSV control bit is inserted, the number of times of successive occurrence of Tmin is limited to five times according to, in particular, plural minimum-run-successive-occurrence-limitation patterns. Simulations were performed for the 1.7 PP code in the past in Table 2 and the code according to Table 3.

Random data 634,880-bit data created arbitrarily was subjected to the DSV control by inserting one DSV control bit at intervals of 45-bit data taking into account a synchronization pattern and converted into a code word string (a channel bit string) in accordance with Table 2 or Table 3. Moreover, the synchronization pattern was inserted at intervals of data-row-equivalent 1240-bit data. After all, the number of channel bits was 989,184 code words (channel bits). In this case, a distribution of occurrence of minimum run successive occurrence of the code word string generated is as described below. In Table 9, the number of times of occurrence of minimum run successive occurrence in the case in which the number of times of successive occurrence of the minimum run is n is represented as RMTR(n).

TABLE 9

| | *** Comparison of 1,7PP *** | |
| --- | --- | --- |
| | 1,7PP in Table 2 | 1,7PP in Table 3 |
| RMRT(1) | 42730 | 42842 |
| RMTR(2) | 17458 | 17540 |
| RMTR(3) | 6353 | 6364 |
| RMTR(4) | 2536 | 2538 |
| RMTR(5) | 652 | 658 |
| RMTR(6) | 149 | — |
| RMTR(7) | — | — |
| Max-RMTR | 6 | 5 |

It is confirmed from Table 9 that, whereas the number of times of successive occurrence of the minimum run is six in the 1,7 PP code in Table 2, the number of times of successive occurrence of the minimum run is limited to five in the 1,7 PP code in Table 3. It is seen that, as the distribution of occurrence of successive occurrence of the minimum run, no successive occurrence of the minimum run occurs in RMTR (6) and there is no substantial difference of the number of times of occurrence in RMTR(1) to RMTR(5), that is, the portion of RMTR(6) is solely replaced with another run length.

In the 1,7 PP code, in the modulation table with the minimum run d=1, the maximum run k=7, and the conversion rate (m:n)=(2:3), a replacement pattern for limiting the number of times of repetition of a minimum run length is provided. Thus, there are the following advantages.

(1) Recording and reproduction at high linear density and allowance for tangential tilt are improved.

(2) Portions with a small signal level are reduced, accuracy of waveform processing such as AGC (Auto Gain Control) and PLL (Phase-Locked Loop) is improved, and it is possible to improve an overall characteristic.

(3) Compared with the technique in the past, it is possible to design a path memory length in the case of Viterbi decoding short and reduce a circuit size.

When the number of "1s" in elements of a data pattern and the number of "1s" in elements of a code pattern constituting conversion patterns of the modulation table are divided by 2, the remainders are the same, either "1" or "0". Thus, there are the following advantages.

(4) It is possible to reduce redundant bits for control of DSV.

(5) In the minimum run d=1 and (m,n)=(2,3), it is possible to perform the DSV control with 1.5 code words.

(6) Redundancy is small and it is possible to preserve the minimum run and the maximum run. Moreover, since limitation of the number of times of successive occurrence of the minimum run is reduced from six times to five times in the table in Table 3 compared with the 1,7 PP code in Table 2, it is possible to further reduce error propagation at the time of data recording and reproduction.

As described above, as a pattern of a data reproduction error, all edges from a leading edge to a last edge of successive minimum marks shift all at once to cause errors. In other words, a bit error length generated is propagated from the top to the last in a section of successive minimum runs. This causes a problem in that error propagation is long. However, by limiting successive occurrence of the minimum run to five times, it is possible to reduce such occurrence of errors and realize more stable recording and reproduction of data.

In the table according to this embodiment, compared with the 1,7 PP code in Table 2, a basic parameter is the same and compactness of the table is substantially the same. Thus, it is possible to realize the advantages described above while maintaining easiness of a circuit configuration.

Figure 22:
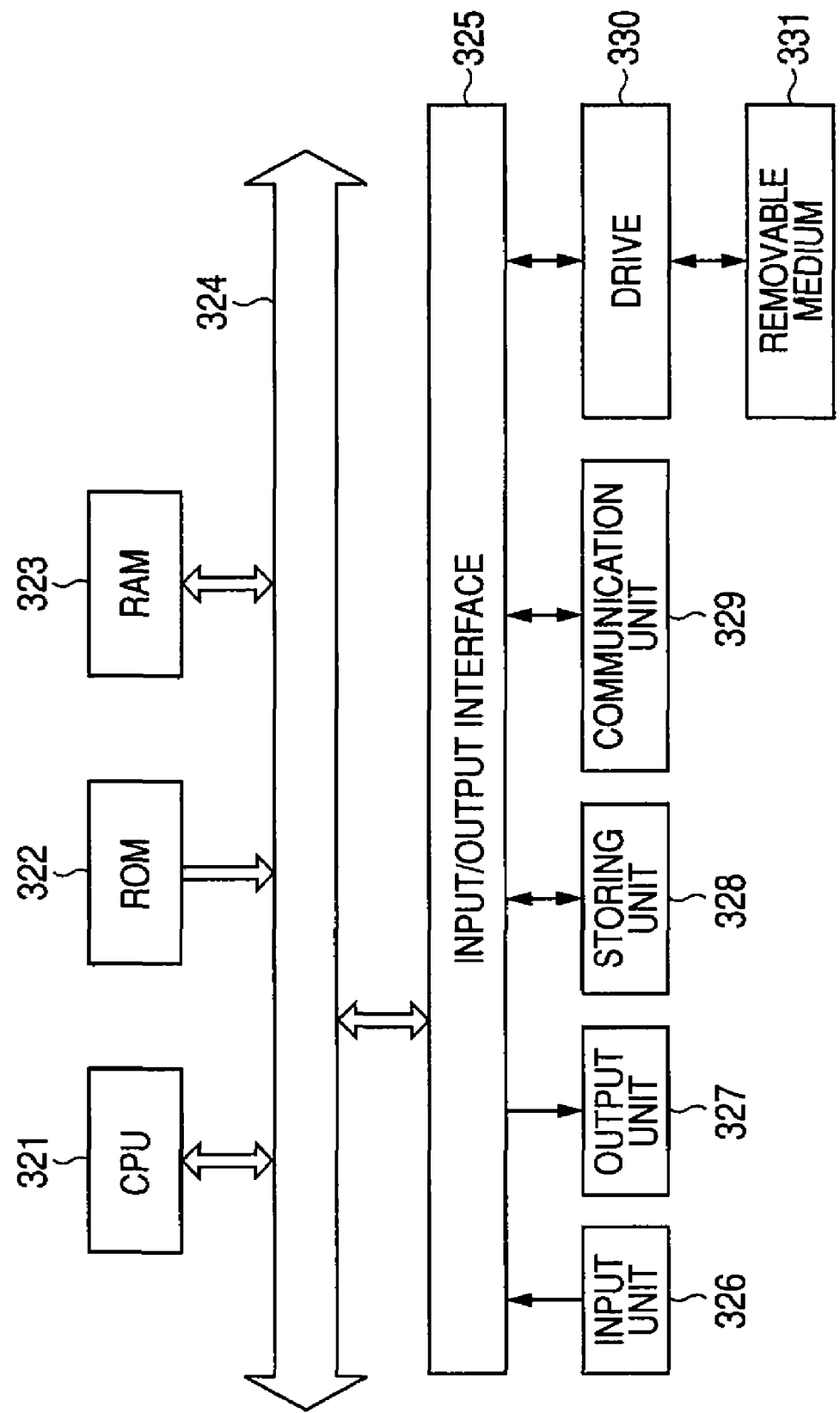
FIG. 22 is a block diagram showing a structure of a personal computer.

FIG. 22 is a block diagram showing an example of a structure of a personal computer that executes the series of processing described above according to a program. A CPU (Central Processing Unit) 321 executes various kinds of processing in accordance with programs stored in a ROM (Read Only Memory) 322 or a storing unit 328. The programs executed by the CPU 321, data, and the like are appropriately stored in a RAM (Random Access Memory) 323. The CPU 321, the ROM 322, and the RAM 323 are connected to one another by a bus 324.

An input/output interface 325 is connected to the CPU 321 via the bus 324. An input unit 326 including a keyboard, a mouse, and a microphone and an output unit 327 including a display and a speaker are connected to the input/output interface 325. The CPU 321 executes various kinds of processing in response to instructions inputted from the input unit 326. The CPU 321 outputs results of the processing to the output unit 327.

The storing unit 328 connected to the input/output interface 325 is constituted by, for example, a hard disk and stores the programs executed by the CPU 321 and various data. The communication unit 329 communicates with external apparatuses via networks such as the Internet and a local area network. Programs may be acquired via the communication unit 329 and stored in the storing unit 328.

When a removable medium 331 such as a magnetic disk, an optical disk, a magneto-optical disk, or a semiconductor memory is inserted in a drive 330 connected to the input/output interface 325, the drive 330 drives the removable medium 331 and acquires programs and data recorded thereon. The programs and the data acquired are transferred to the storing unit 328 and stored therein if necessary.

The series of processing can be executed by hardware or can be executed by software. When the series of processing is executed by software, a program constituting the software is installed, from program storage media, in a computer built in dedicated hardware or, for example, a general-purpose personal computer capable of executing various functions by installing various programs.

The program storage media that store the programs installed in the computer and executable by the computer include, as shown in FIG. 22, the removable medium 331 serving as a package medium constituted by a magnetic disk (including a flexible disk), an optical disk (including a CD-ROM (Compact Disc-Read Only Memory) and a DVD (Digital Versatile Disc)), a magneto-optical disk (including an MD (Mini-Disc)™), or a semiconductor memory, the ROM 322 in which the programs are temporarily or permanently stored, and the hard disk constituting the storing unit 328. Storage of the programs in the program storage media is performs, if necessary, via the communication unit 329 serving as an interface such as a router or a modem using a wire or radio communication medium such as a local area network, the Internet, or digital satellite broadcast.

In this specification, steps describing the programs stored in the program storage media include not only processing performed in time series according to an order described but also processing executed in parallel or individually, although not performed in time series.

It should be understood by those skilled in the art that various modifications, combinations, sub-combinations, and alterations may occur depending on design requirements and the other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A modulation table for converting data with a basic data length of m bits into a variable length code (d,k;m,n;r) (a maximum constraint length r>1) with a basic code word length of n bits, a minimum run of which is d (d>0) and a maximum run of which is k, the modulation table comprising:
- a basic table for converting data patterns including basic data with a basic data length of m bits into code patterns including a basic code of a variable length code with a basic code word length of n bits; and
- a replacement table for replacing data patterns including replacement data with code patterns including a replacement code,
- wherein the replacement table includes minimum-run-successive-occurrence limiting data patterns, which serve as the data patterns, for limiting the number of times of successive occurrences of the minimum run to N (N>1) or less and minimum-run-successive-occurrence limiting code patterns, which serves as the code patterns, corresponding to the minimum-run-successive-occurrence limiting data patterns,
- wherein at least one of the minimum-run-successive-occurrence limiting code patterns includes an undetermined code, a value of which is determined according to an immediately-preceding or immediately-following code word string, and
- wherein a condition for determining whether the minimum-run-successive-occurrence limiting code pattern including the undetermined code is converted as a whole or divided and converted individually is defined by a data bit immediately following the minimum-run-successive-occurrence limiting data pattern corresponding to the minimum-run-successive-occurrence limiting code pattern including the undetermined code.

2. The modulation table according to claim 1, wherein the condition is defined as a minimum-run-successive-occurrence limiting data pattern partially including a first minimum-run-successive-occurrence limiting data pattern, which is the minimum-run-successive-occurrence limiting data pattern corresponding the minimum-run-successive-occurrence limiting code pattern including the undetermined code, the minimum-run-successive-occurrence limiting data pattern being a second minimum-run-successive-occurrence limiting data pattern obtained by dividing the entire minimum-run-successive-occurrence limiting data pattern and individually converting the divided patterns.

3. The modulation table according to claim 2, wherein a third minimum-run-successive-occurrence limiting data pattern included in the first minimum-run-successive-occurrence limiting data pattern is collectively converted into other replacement codes not including the undetermined code when the next three codes are "010".

4. The modulation table according to claim 1, wherein the condition is defined as a data bit located immediately following the minimum-run-successive-occurrence limiting data pattern corresponding to the minimum-run-successive-occurrence limiting code pattern including the undetermined code.

5. The modulation table according to claim 1, wherein the minimum-run-successive-occurrence limiting code pattern including the undetermined code includes, in limiting successive occurrence of the minimum run at d=1, a code word "$0$" including an undetermined code "$" that is "0" when immediately-preceding three codes are "010" and is "1" when the immediately-preceding three codes are not "010".

6. The modulation table according to claim 5, wherein the code word "$0$" is set to "000" when an immediately-preceding code is "1".

7. The modulation table according to claim 1, wherein the number of times of successive occurrence N of the minimum run is set to five times or less.

8. A modulating apparatus that converts data with a basic data length of m bits into a variable length code (d,k;m,n;r) (a maximum constraint length r>1) with a basic code word length of n bits, a minimum run of which is d and a maximum run of which is k, the modulating apparatus comprising:
- first converting means for collectively converting portions of input data coinciding with a first minimum-run-successive-occurrence limiting data pattern for limiting the number of times of successive occurrence of the minimum run to N (N>1) or less into a first minimum-run-successive-occurrence limiting code pattern including an undetermined code that corresponds to the first minimum-run-successive-occurrence limiting data pattern;
- deciding means for deciding the undetermined code;
- second converting means for individually converting portions of the input data coinciding with partial data patterns forming a part of the first minimum-run-successive-occurrence limiting data pattern into code patterns corresponding to the portions;
- detecting means for detecting a condition in collectively converting the first minimum-run-successive-occurrence limiting data pattern into the first minimum-run-successive-occurrence limiting code pattern from data bits forming the input data; and
- selecting means for selecting, if it is detected that the input data satisfies the condition, the first minimum-run-successive-occurrence limiting code pattern that is collectively converted and includes the undetermined code decided and selecting, if it is detected that the input data does not satisfy the condition, the code patterns obtained by individually converting the first-minimum-run-successive-occurrence limiting data pattern for each of the partial data patterns.

9. The modulating apparatus according to claim 8, wherein the selecting means determines that the condition is satisfied when the input data includes a portion coinciding with the first minimum-run-successive-occurrence limiting data pattern and a data bit immediately following the coinciding portion is not a predetermined data bit set in advance.

10. The modulating apparatus according to claim 8, further comprising:
- RLL information generating means for generating information for preserving an RLL rule; and
- limitation-information generating means for generating information for limiting the number of times of successive occurrence of the minimum run to N or less,
- wherein the deciding means decides the undetermined code on the basis of the information for preserving the RLL rule generated and the information for limiting the number of times of successive occurrence of the minimum run to N or less generated.

11. The modulating apparatus according to claim 10, further comprising third converting means for collectively converting portions of input data coinciding with a second minimum-run-successive-occurrence limiting data pattern forming data patterns of a part of the first minimum-run-successive-occurrence limiting data pattern into a second minimum-run-successive-occurrence limiting code pattern different from the first minimum-run-successive-occurrence limiting code pattern,
wherein the selecting means selects the second minimum-run-successive-occurrence limiting code pattern when three codes following the second minimum-run-successive-occurrence limiting data pattern are "010".

12. The modulating apparatus according to claim 8, further comprising storing means for storing at least 12-bit data among the input data.

13. The modulating apparatus according to claim 8, wherein the first converting means limits the number of times of successive occurrence of the minimum run to 5 or less.

14. A recording medium having recorded therein a signal modulated by a modulating apparatus that converts data with a basic data length of m bits into a variable length code (d,k;m,n;r) (a maximum constraint length r>1) with a basic code word length of n bits, a minimum run of which is d and a maximum run of which is k, the modulating apparatus comprising:

first converting means for collectively converting portions of input data coinciding with a first minimum-run-successive-occurrence limiting data pattern for limiting the number of times of successive occurrence of the minimum run to N (N>1) or less into a first minimum-run-successive-occurrence limiting code pattern including an undetermined code that corresponds to the first minimum-run-successive-occurrence limiting data pattern;

deciding means for deciding the undetermined code;

second converting means for individually converting portions of the input data coinciding with partial data patterns forming a part of the first minimum-run-successive-occurrence limiting data pattern into code patterns corresponding to the portions;

detecting means for detecting a condition in collectively converting the first minimum-run-successive-occurrence limiting data pattern into the first minimum-run-successive-occurrence limiting code pattern from data bits forming the input data; and selecting means for selecting, if it is detected that the input data satisfies the condition, the first minimum-run-successive-occurrence limiting code pattern that is collectively converted and includes the undetermined code decided and selecting, if it is detected that the input data does not satisfy the condition, the code patterns obtained by individually converting the first-minimum-run-successive-occurrence limiting data pattern for each of the partial data patterns.

15. A modulating method of converting data with a basic data length of m bits into a variable length code (d,k;m,n;r) (a maximum constraint length r>1) with a basic code word length of n bits, a minimum run of which is d and a maximum run of which is k, the modulating method comprising:

collectively converting portions of input data coinciding with a minimum-run-successive-occurrence limiting data pattern for limiting the number of times of successive occurrence of the minimum run to N (N>1) or less into a minimum-run-successive-occurrence limiting code pattern including an undetermined code that corresponds to the minimum-run-successive-occurrence limiting data pattern;

deciding the undetermined code;

individually converting portions of the input data coinciding with partial data patterns forming a part of the minimum-run-successive-occurrence limiting data pattern into code patterns corresponding to the portions;

detecting a condition in collectively converting the minimum-run-successive-occurrence limiting data pattern into the minimum-run-successive-occurrence limiting code pattern including the undetermined code from data bits forming the input data; and selecting, if it is detected that the input data satisfies the condition, the minimum-run-successive-occurrence limiting code pattern that is collectively converted and includes the undetermined code decided and selecting, if it is detected that the input data does not satisfy the condition, the code patterns obtained by individually converting the minimum-run-successive-occurrence limiting data pattern for each of the partial data patterns.

16. A program for converting data with a basic data length of m bits into a variable length code (d,k;m,n;r) (a maximum constraint length r>1) with a basic code word length of n bits, a minimum run of which is d and a maximum run of which is k, the program causing a computer to execute the steps of:

collectively converting portions of input data coinciding with a minimum-run-successive-occurrence limiting data pattern for limiting the number of times of successive occurrence of the minimum run to N (N>1) or less into a minimum-run-successive-occurrence limiting code pattern including an undetermined code that corresponds to the minimum-run-successive-occurrence limiting data pattern;

deciding the undetermined code;

individually converting portions of the input data coinciding with partial data patterns forming a part of the minimum-run-successive-occurrence limiting data pattern into code patterns corresponding to the portions;

detecting a condition in collectively converting the minimum-run-successive-occurrence limiting data pattern into the minimum-run-successive-occurrence limiting code pattern including the certain code from data bits forming the input data; and selecting, if it is detected that the input data satisfies the condition, the minimum-run-successive-occurrence limiting code pattern that is collectively converted and includes the undetermined code decided and selecting, if it is detected that the input data does not satisfy the condition, the code patterns obtained by individually converting the minimum-run-successive-occurrence limiting data pattern for each of the partial data patterns.

17. A recording medium having recorded therein a program for converting data with a basic data length of m bits into a variable length code (d,k;m,n;r) (a maximum constraint length r>1) with a basic code word length of n bits, a minimum run of which is d and a maximum run of which is k, the program causing a computer to execute the steps of:

collectively converting portions of input data coinciding with a minimum-run-successive-occurrence limiting data pattern for limiting the number of times of successive occurrence of the minimum run to N (N>1) or less into a minimum-run-successive-occurrence limiting code pattern including an undetermined code that corresponds to the minimum-run-successive-occurrence limiting data pattern;

deciding the undetermined code;

individually converting portions of the input data coinciding with partial data patterns forming a part of the minimum-run-successive-occurrence limiting data pattern into code patterns corresponding to the portions;

detecting a condition in collectively converting the minimum-run-successive-occurrence limiting data pattern into the minimum-run-successive-occurrence limiting code pattern including the certain code from data bits forming the input data; and selecting, if it is detected that the input data satisfies the condition, the minimum-run-successive-occurrence limiting code pattern that is collectively converted and includes the undetermined code decided and selecting, if it is detected that the input data does not satisfy the condition, the code patterns obtained by individually converting the minimum-run-successive-occurrence limiting data pattern for each of the partial data patterns.

18. A modulating apparatus that converts data with a basic data length of m bits into a variable length code (d,k;m,n;r) (a maximum constraint length r>1) with a basic code word length of n bits, a minimum run of which is d and a maximum run of which is km, the modulating apparatus comprising:

a first converting unit collectively converting portions of input data coinciding with a first minimum-run-successive-occurrence limiting data pattern for limiting the number of times of successive occurrence of the minimum run to N (N>1) or less into a first minimum-run-successive-occurrence limiting code pattern including an undetermined code that corresponds to the first minimum-run-successive-occurrence limiting data pattern;

a deciding unit deciding the undetermined code;

a second converting unit individually converting portions of the input data coinciding with partial data patterns forming a part of the first minimum-run-successive-occurrence limiting data pattern into code patterns corresponding to the portions;

a detecting unit detecting a condition in collectively converting the first minimum-run-successive-occurrence limiting data pattern into the first minimum-run-successive-occurrence limiting code pattern from data bits forming the input data; and a selecting unit selecting, when it is detected that the input data satisfies the condition, the first minimum-run-successive-occurrence limiting code pattern that is collectively converted and includes the undetermined code decided and selecting, when it is detected that the input data does not satisfy the condition, the code patterns obtained by individually converting the first-minimum-run-successive-occurrence limiting data pattern for each of the partial data patterns.

* * * * *